(12) United States Patent
Wu

(10) Patent No.: US 6,552,382 B1
(45) Date of Patent: Apr. 22, 2003

(54) SCALABLE VERTICAL DRAM CELL STRUCTURE AND ITS MANUFACTURING METHODS

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 0 days.

(21) Appl. No.: 10/262,201

(22) Filed: Sep. 30, 2002

(51) Int. Cl.[7] .................. H01L 27/108; H01L 21/8242; H01L 29/76; H01L 29/94; H01L 31/119

(52) U.S. Cl. ................ 257/305; 257/301; 257/302; 257/303; 257/304; 438/244; 438/387

(58) Field of Search ................ 257/301–305; 438/243–249, 386–392

(56) References Cited

U.S. PATENT DOCUMENTS

| | | | | |
|---|---|---|---|---|
| 5,525,531 A | * | 6/1996 | Bronner et al. | 438/152 |
| 5,831,301 A | * | 11/1998 | Horak et al. | 257/302 |
| 5,977,578 A | * | 11/1999 | Tang | 257/296 |
| 5,998,821 A | * | 12/1999 | Hieda et al. | 257/301 |
| 6,265,742 B1 | * | 7/2001 | Gruening et al. | 257/304 |
| 6,391,705 B1 | * | 5/2002 | Hsiao et al. | 438/243 |
| 6,489,646 B1 | * | 12/2002 | Jang | 257/296 |
| 2002/0004271 A1 | * | 1/2002 | Weis | 438/243 |
| 2003/0003651 A1 | * | 1/2003 | Divakaruni et al. | 438/243 |

FOREIGN PATENT DOCUMENTS

| | | | | |
|---|---|---|---|---|
| JP | 63169062 A | * | 7/1988 | H01L/27/10 |
| JP | 01236648 A | * | 9/1989 | H01L/27/10 |
| WO | WO 9303501 A1 | * | 2/1993 | H01L/27/10 |

* cited by examiner

Primary Examiner—John F. Niebling
Assistant Examiner—Jennifer M. Kennedy
(74) Attorney, Agent, or Firm—Pro-Techtor International Services

(57) ABSTRACT

A scalable vertical DRAM cell structure comprising a scalable trench region and a self-aligned common-drain diffusion region are disclosed by the present invention, in which the scalable trench region comprises a deep-trench region having a vertical transistor and a second-type STI region being defined by a spacer technique. The scalable vertical DRAM cell structure can offer a DARM cell size equal to or smaller than $4F^2$ and is used to implement two contactless DRAM arrays. A first-type contactless DRAM array comprises a plurality of metal bit-lines integrated with planarized common-drain conductive islands and a plurality of highly conductive word-lines. A second-type contactless DRAM array comprises a plurality of metal word-lines integrated with planarized common-gate conductive islands over common-gate conductive connector islands and a plurality of common-drain conductive bit-lines.

12 Claims, 24 Drawing Sheets

6,552,382 B1

SCALABLE VERTICAL DRAM CELL STRUCTURE AND ITS MANUFACTURING METHODS

BACKGROUND OF THE INVENTION

1. Field of the Invention

The present invention relates generally to a vertical DRAM memory cell and its manufacturing method and, more particularly, to a scalable vertical DRAM cell structure and its manufacturing methods.

2. Description of Related Art

A dynamic random-access-memory (DRAM) cell including an access transistor and a storage capacitor has become the most important storage element in electronic system, especially in computer and communication system. The DRAM density is increased very rapidly in order to decrease the cost per bit and, therefore, an advanced photolithography is in general needed to decrease the minimum-feature-size (F) of a cell.

The output voltage of a DRAM cell is proportional to the capacitance value of the storage capacitor of the DRAM cell and, therefore, the storage capacitor must have a satisfactory capacitance value to have stable operation of the cell as the applied voltage is scaled. Basically, the storage capacitor can be implemented in a trench-type or a stack-type. The trench-type is formed by forming a deep trench in a semiconductor substrate without increasing the surface area of the semiconductor-substrate surface. The stack-type is formed by implementing a capacitor structure over the access transistor and its nearby dummy-transistor structure through the conductive contact-plug over the node diffusion region of the access transistor. Basically, the cell size of the stack-type DRAM is limited by a dummy transistor being formed over the isolation region. Accordingly, the limit cell size of the stack-type DRAM is $8F^2$ for shallow-trench-isolation. However, the cell size of a trench-type lateral-transistor DRAM is limited by the space between nearby deep-trench capacitors and the separation between the lateral access transistor and the deep-trench capacitor. Therefore, the limit cell size of a trench-type lateral-transistor DRAM is also $8F^2$ if the separation between the lateral access transistor and the trench capacitor can't be minimized.

A typical example of a trench-type lateral-transistor DRAM cell is shown in FIG. 1, in which a deep trench is formed in a semiconductor substrate 100. A trench capacitor is formed in a lower portion of the deep trench, in which a lower capacitor node 101 is formed by a heavily-doped n+ diffusion region using an arsenic-silicate-glass (ASG) film as a dopant diffusion source; an upper capacitor node 103a is made of doped polycrystalline-silicon; and a capacitor-dielectric layer 102 is formed by a composite dielectric layer such as an oxide-nitride- oxide structure or a nitride-oxide structure. An oxide collar 104 is used to separate the lower capacitor node 101 from a source diffusion region 105a, 105b, and a capacitor-node connector 103b being made of doped polycrystalline-silicon is used to electrically connect the upper capacitor node 103a to a source conductive node 103c. The source conductive node 103c is made of heavily-doped polycrystalline-silicon to act as a dopant diffusion source for forming an n+ source diffusion region 105a. A shallow-trench-isolation (STI) region 106 is filled with a CVD-oxide layer in order to separate nearby trench capacitors. Two gate- stacks 108, 109 are formed over an upper surface, in which one gate-stack 108 is acted as a passing word-line and another gate-stack 109 being acted as an excess transistor. A common-source diffusion region 105b and a common-drain diffusion region 107 for a bit-line node are formed in an upper surface of the semiconductor substrate 100. From FIG. 1, it is clearly seen that the limit cell size is $8F^2$ if the space between two nearby trench capacitors is defined to be a minimum-feature-size (F) of technology used. It is clearly seen that the cell size can be further reduced if the separation between two adjacent deep trenches and the common-source region can be reduced.

Apparently, the common-source diffusion region 105b, 105a and the gate-stack 109 shown in FIG. 1 can be removed and are formed in the deep-trench region to become a vertical DRAM cell structure, then the semiconductor surface area can be saved at least $4F^2$. However, a depth of the deep trenches becomes deeper, resulting in a further problem for forming a deeper trench. Moreover, the threshold-voltage and the punch-through voltage of the vertical transistor are difficult to be controlled, and a longer channel length is therefore used by the prior art. As a consequence, a deeper trench depth is required, and a slower read/write speed of a memory cell due to a longer channel length becomes another serious problem for the prior art.

It is, therefore, a major objective of the present invention to offer a scalable vertical DRAM cell structure for obtaining a scalable cell size of $4F^2$ or smaller.

It is another objective of the present invention to easily offer different implanted regions for forming punch-through stops and threshold-voltage adjustments of the vertical transistor and the parasitic collar-oxide transistor in a self-aligned manner so a deeper trench is not required.

It is a further objective of the present invention to offer a manufacturing method for forming the scalable vertical DRAM cell structure by using self-aligned techniques with less critical masking photoresist steps.

It is yet another objective of the present invention to offer two different contactless DRAM array structures for high-speed read and write operations.

SUMMARY OF THE INVENTION

A scalable vertical DRAM cell structure and its contactless DRAM arrays are disclosed by the present invention. The scalable vertical DRAM cell structure comprises a scalable trench region and a self-aligned common-drain diffusion region of a second conductivity type, in which the scalable trench region comprises a deep-trench region having a vertical transistor and a second-type shallow-trench-isolation region being defined by a first sidewall dielectric spacer and the self-aligned common-drain diffusion region comprises a lightly-doped common-drain diffusion region being formed within a shallow heavily-doped diffusion region. The deep-trench region comprises a lower capacitor node made of an n+ diffusion region being formed in a lower portion of a deep trench, a capacitor-dielectric layer being formed over the lower capacitor node, an upper capacitor node made of a planarized heavily-doped polycrystalline-silicon layer being formed over the capacitor-dielectric layer, a collar-oxide layer being formed over the capacitor-dielectric layer and a portion of the upper capacitor node, a source conductive node integrated with a capacitor-node connector being formed on a portion of the upper capacitor node, a common-source diffusion region being formed by out-diffusion of the source conductive node, an isolation-oxide node being formed over the capacitor-node connector, and a conductive-gate node of a vertical transistor defined by a second sidewall dielectric spacer being formed on the isolation-silicon-dioxide node. The second-type shallowtrench-isolation region being formed outside of the first sidewall dielectric spacer comprises a second-type raised field-oxide layer with a bottom surface level approximately equal to that of the collar-oxide layer and an n+ diffusion region being formed under the second-type raised field-oxide layer. The vertical transistor comprises a capping conductive-gate layer formed outside of a third sidewall dielectric spacer and integrated with the conductive-gate node being defined by a fourth sidewall dielectric spacer, a gate-dielectric layer being formed over a sidewall of the deep trench, a self-aligned common-drain diffusion region being formed over an upper semiconductor surface, and a common-source diffusion region of the second conductivity type being formed near the source conductive node for forming a first-type scalable vertical DRAM cell; and comprises the conductive-gate node being defined by a second sidewall dielectric spacer, a planarized common-gate conductive island integrated with a metal word-line being connected with the conductive-gate node through a common-gate conductive connector island, a gate-dielectric layer being formed over a sidewall of the deep trench, a self-aligned common-drain diffusion region being formed over an upper semiconductor surface, and a common-source diffusion region being formed near the source conductive node for forming a second-type scalable vertical DRAM cell. The self-aligned common-drain region comprises a shallow heavily-doped common-drain diffusion region formed within a lightly-doped common-drain diffusion region and said semiconductor substrate under said self-aligned common-drain diffusion region comprises a deep implant region of the first conductivity type being formed near a middle portion outside of said gate-dielectric layer and a deeper implant region of the first conductivity type being formed near a middle portion outside of said collar-oxide layer. A planarized common-drain conductive island integrated with a metal bit-line being formed on the shallow heavily-doped common-drain diffusion region outside of a fifth sidewall dielectric spacer being formed over a sidewall of the deep-trench region for forming the first-type scalable vertical DRAM cell; and a common-drain conductive bit-line being formed over the shallow heavidly-doped common-drain diffusion region and two first-type fourth raised field-oxide layers outside of a fifth sidewall dielectric spacer being formed over a sidewall of the deep-trench region for forming the second-type scalable vertical DRAM cell. The cell size of the scalable vertical DRAM cell structure is scalable and can be fabricated to be equal to or smaller than $4F^2$.

The scalable vertical DRAM cell structure of the present invention is used to implement two contactless DRAM arrays. A first-type contactless DRAM array comprises a plurality of first-type scalable vertical DRAM cells, a plurality of metal bit-lines integrated with the planarized common-drain conductive islands being patterned to be aligned above a plurality of active regions, and a plurality of capping conductive-gate layers integrated with the conductive-gate nodes to act as a plurality of conductive word-lines being formed transversely to the plurality of metal bit-lines. A second-type contactless DRAM array comprises a plurality of second-type scalable vertical DRAM cells, a plurality of metal word-lines integrated with planarized common-gate conductive islands over common-gate conductive connector islands being patterned to be aligned above a plurality of active regions, and a plurality of highly conductive common-drain bus-lines acted as a plurality of conductive bit-lines being formed transversely to the plurality of metal word-lines.

DETAILED DESCRIPTION OF THE PREFERRED EMBODIMENTS

Figure 1:
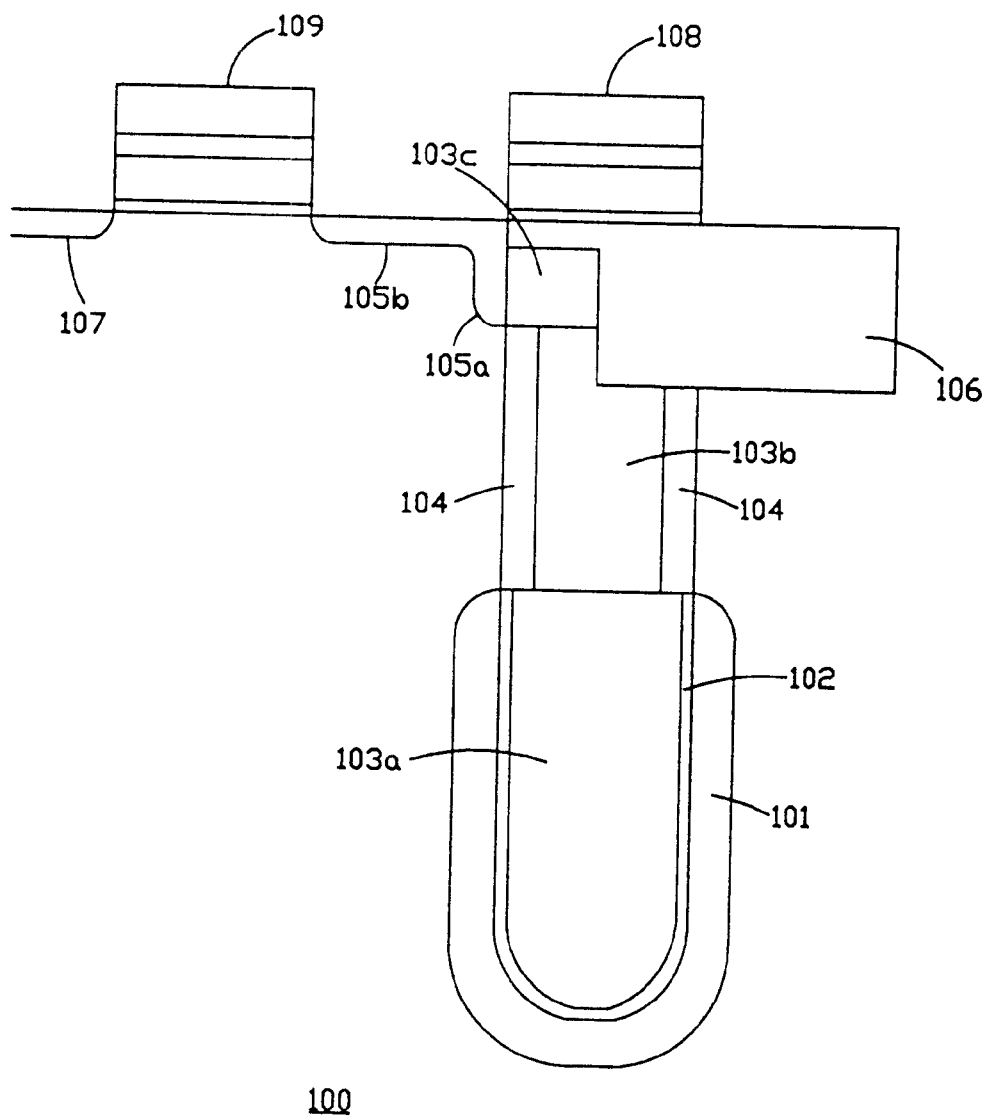
FIG. 1 shows a typical schematic diagram of a trench-type lateral-transistor DRAM cell of the prior art.
Figure 2A:
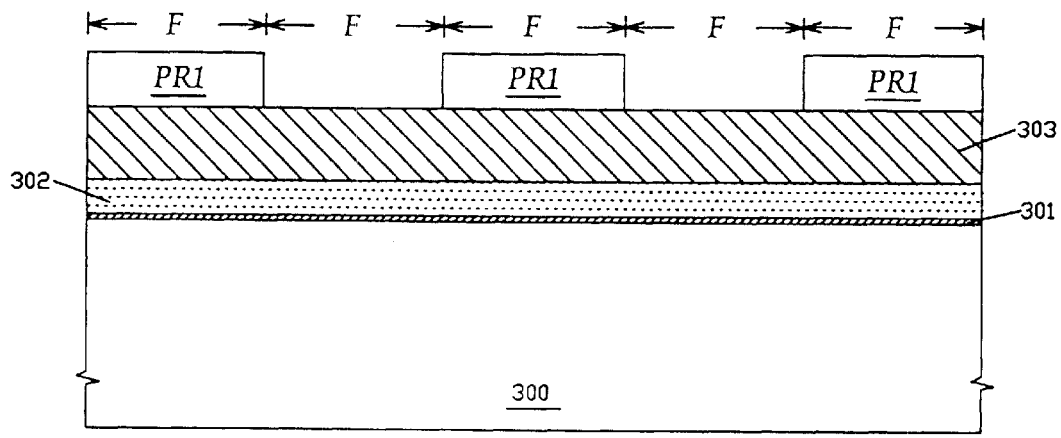
FIG. 2A through FIG. 2C show the process steps and their cross-sectional views of fabricating a first-type shallow-trench-isolation structure for forming a scalable vertical DRAM cell structure of the present invention.
Figure 2B:
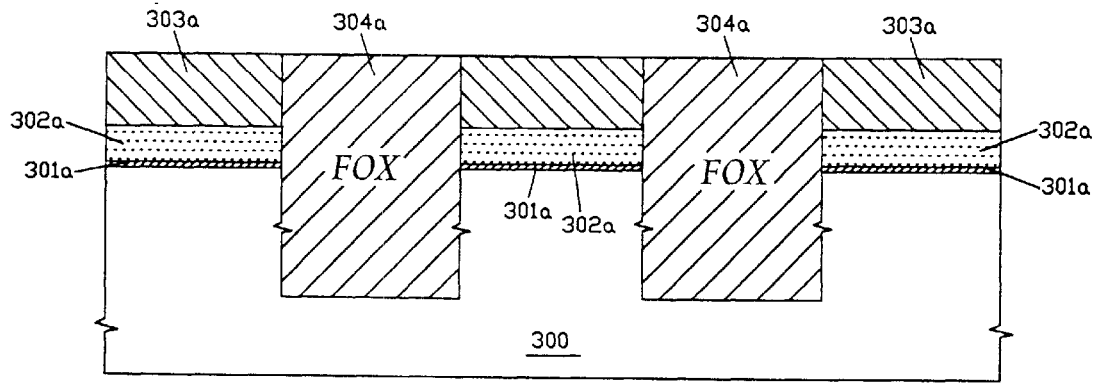
Figure 2C:
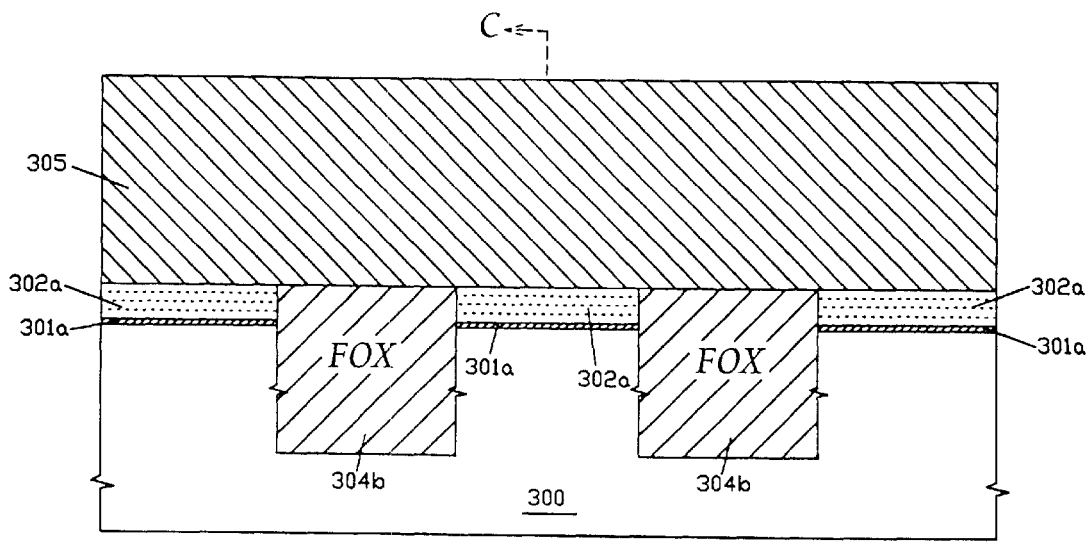

Referring now to FIG. 2A through FIG. 2C, there are shown the process steps and their cross-sectional views of fabricating a first-type shallow-trench-isolation (STI) structure for forming a scalable vertical DRAM cell structure of the present invention. FIG. 2A shows that a first dielectric layer 301 is formed on a semiconductor substrate 300 of a first conductivity type, a first conductive layer 302 is formed on the first dielectric layer 301, a first masking dielectric layer 303 is formed over the first conductive layer 302, and a plurality of masking photoresist PR1 are formed over the first masking dielectric layer 303 to define a plurality of active regions (under PR1) and a plurality of first-type shallow-trench-isolation regions (STI-1) (outside of PR1). The first dielectric layer 301 is preferably a thermal-oxide layer or a nitrided thermal-oxide layer and its thickness is preferably between 50 Angstroms and 200 Angstroms. The first conductive layer 302 is preferably a doped polycrystalline-silicon or doped amorphous-silicon layer as deposited by low-pressure chemical-vapor-deposition (LPCVD) and its thickness is preferably between 200 Angstroms and 3000 Angstroms. The first masking dielectric layer 303 is preferably made of silicon-nitride as deposited by LPCVD and its thickness is preferably between 1000 Angstroms and 3000 Angstroms. It should be noted that a first anti-reflection coating (ARC) layer (not shown) can be formed over the first masking dielectric layer 303 to act as a hard masking layer for patterning the first masking dielectric layer 303.

FIG. 2B shows that the first masking dielectric layer 303, the first conductive layer 302, and the first dielectric layer 301 outside of the plurality of masking photoresist PR1 are sequentially removed by using anisotropic dry etching; the semiconductor substrate 300 is then anisotropically etched to form a plurality of first-type shallow trenches, and the plurality of masking photoresist PR1 are then stripped; and subsequently, the plurality of first-type shallow trenches are refilled with first-type planarized field-oxide layers 304a. The depth of each of the plurality of first-type shallow trenches in the semiconductor substrate 300 is between 4000

Angstroms and 15000 Angstroms. The first-type planarized field-oxide layer 304a is preferably made of silicon-dioxide, phosphosilicate glass (p-glass), boro-phosphosilicate glass (BP-glass) as deposited by high-density plasma (HDP) CVD or plasma-enhanced (PE) CVD, and is formed by first depositing a thick-oxide film 304 to fill up each gap formed by each of the plurality of first-type shallow trenches and then planarizing the deposited thick-oxide film 304 using chemical-mechanical polishing (CMP) with the first masking dielectric layer 303a as a polishing stop.

FIG. 2C shows that the first-type planarized field-oxide layers 304a are etched back to a depth equal to a thickness of the first masking dielectric layer 303a to form first-type first raised field-oxide layers 304b and then the first masking dielectric layers 303a are removed by using hot-phosphoric acid or anisotropic dry etching; and subsequently, a second masking dielectric layer 305 is formed over a flat surface being alternately formed by a first conductive layer 302a and a first-type first raised field-oxide layer 304b. The second masking dielectric layer 305 is preferably made of silicon-nitride as deposited by LPCVD and its thickness is preferably between 3000 Angstroms and 10000 Angstroms. The cross-sectional view along an active region as indicated by a C–C' line is shown in FIG. 3A.

Referring now to FIG. 3A through FIG. 3K, there are shown the process steps and their cross-sectional views of fabricating a common-platform structure for a scalable vertical DRAM cell structure of the present invention on a first-type shallow-trench-isolation structure shown in FIG. 2C.

Figure 3A:
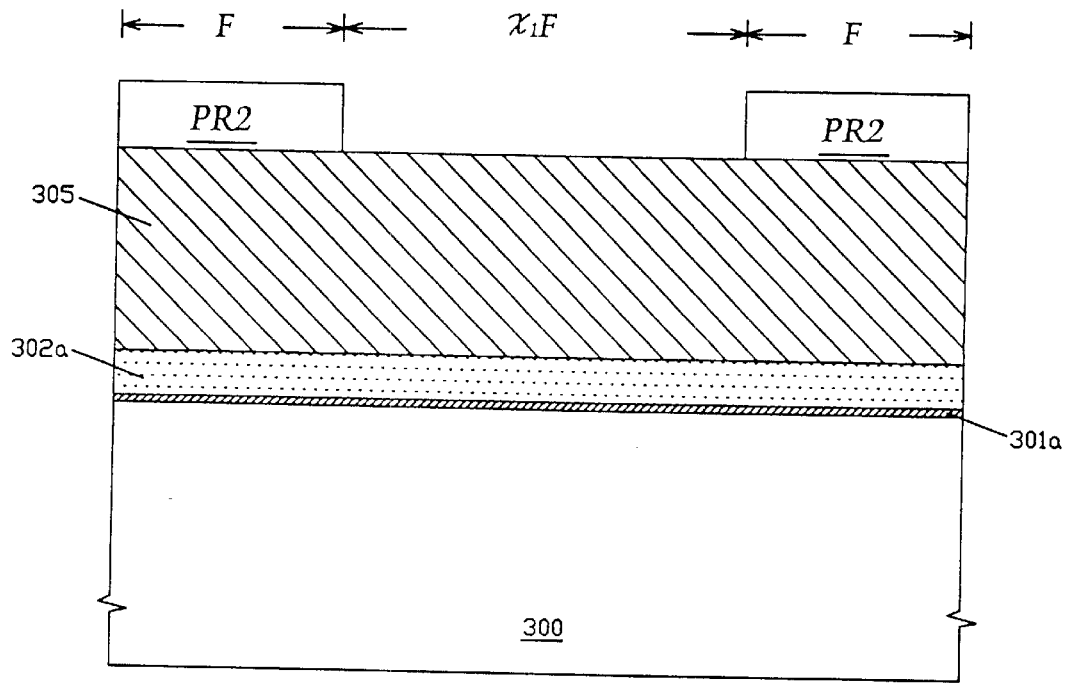
FIG. 3A through FIG. 3K show the process steps and their cross-sectional views of fabricating a common-platform structure for a scalable vertical DRAM cell structure of the present invention.

FIG. 3A shows that a plurality of masking photoresist PR2 are formed over the second masking dielectric layer 305 to define a plurality of scalable trench regions (between PR2) and a plurality of self-aligned common-drain regions (under PR2). Each of the plurality of scalable trench regions as indicated by $X_1F$ comprises a pair of deep-trench regions and a trench-isolation region being located between the pair of deep-trench regions, where $X_1$ is a scale factor. Each of the plurality of self-aligned common-drain regions includes a common-drain diffusion region as indicated by F. Similarly, a second anti-reflection coating (ARC) layer (not shown) can be formed over the second masking dielectric layer 305 to act as a hard masking layer to pattern the second masking dielectric layer 305. The first/second anti-reflection coating (ARC) layer is preferably made of boro-silicate glass (B-glass) as deposited by HDPCVD, PECVD, APCVD, or LPCVD.

Figure 3B:
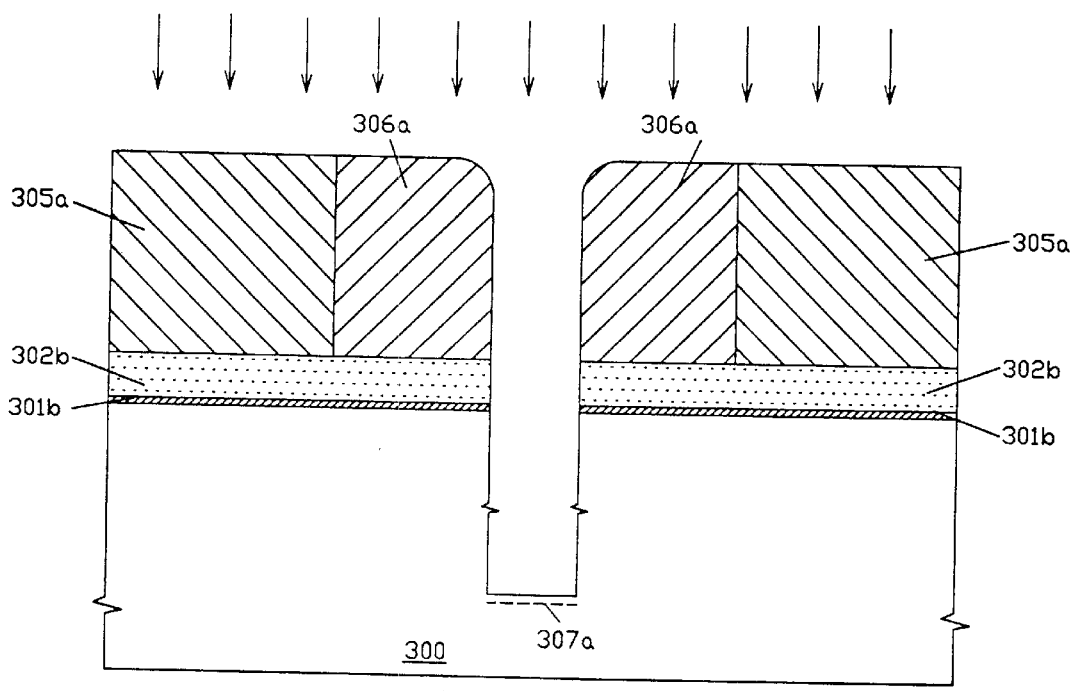

FIG. 3B shows that the second masking dielectric layer 305 outside of the plurality of masking photoresist PR2 are removed by anisotropic dry etching and the plurality of masking photoresist PR2 are stripped; a pair of first sidewall dielectric spacers 306a are then formed over outer sidewalls formed by the removed second masking dielectric layers 305 in each of the plurality of scalable trench regions; and subsequently, the first conductive layer 302a and the first dielectric layer 301a between the pair of first sidewall dielectric spacers 306a are sequentially removed, the semiconductor substrate 300 in each of the plurality of active regions is anisotropically etched to form a plurality of second-type shallow trenches in each of the plurality of scalable trench regions, and an ion-implantation can be preformed in a self-aligned manner to form a heavily-implanted region 307a of a second conductivity type in each bottom semiconductor-surface region of the second-type shallow trenches. The first sidewall dielectric spacer 306a is preferably made of silicon-dioxide as deposited by LPCVD and is formed by first depositing a silicon-dioxide film 306 over the formed structure and then etching back a thickness of the deposited silicon-dioxide film 306.

Figure 3C:
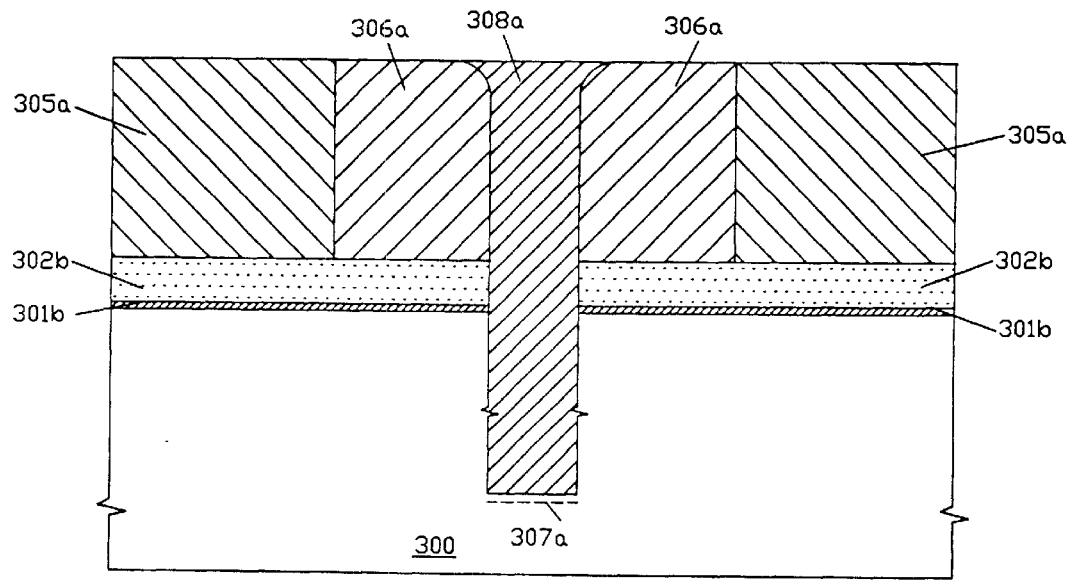

FIG. 3C shows that a second-type planarized field-oxide layer 308a is formed to fill up each gap between the pair of first sidewall dielectric spacers 306a. The second-type planarized field-oxide layer 308a is preferably made of silicon-dioxide as deposited by LPCVD and is formed by first depositing a silicon-dioxide film 308 to fill up each gap between the pair of first sidewall dielectric spacers 306a and then planarizing the deposited silicon-dioxide film 308 using CMP with the second masking dielectric layer 305a as a polishing stop.

Figure 3D:
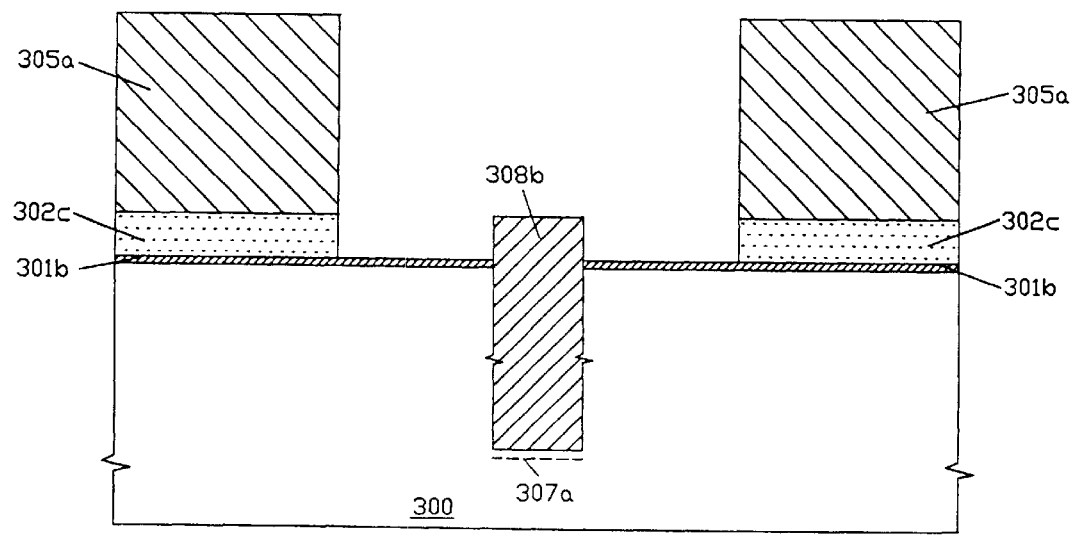

FIG. 3D shows that the pair of first sidewall dielectric spacers 306a and the second-type planarized field-oxide layers 308a are simultaneously etched back to a depth equal to a thickness of the second masking dielectric layer 305a by using anisotropic dry etching or a wet etching solution such as buffered hydrofluoric acid to form second-type first raised field-oxide layers 308b; and subsequently, the first conductive layers 302b in each of the plurality of scalable trench regions are selectively removed by using anisotropic dry etching.

Figure 3E:
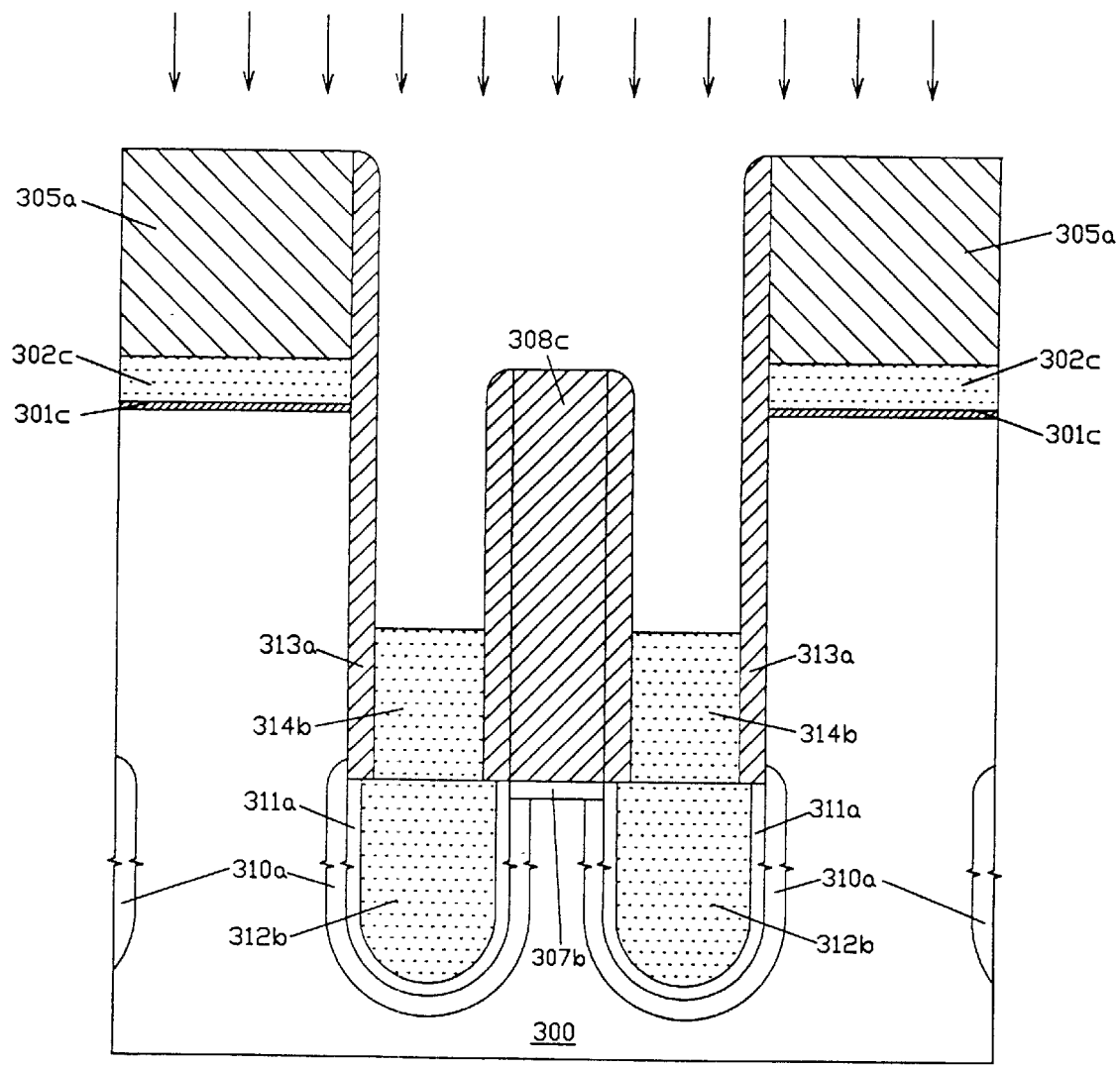

FIG. 3E shows that the first dielectric layers 301b are selectively removed first by anisotropic dry etching, and the second-type first raised field-oxide layers 308b and the first-type first raised field-oxide layers 304b are simultaneously etched to form second-type second raised field-oxide layers 308c and first-type second raised field-oxide layers 304c respectively, a, plurality of deep trenches are then formed in the semiconductor substrate 300 of the plurality of active regions in each of the plurality of scalable trench regions, and thereafter, a lower capacitor node 310a is formed over each lower portion of the deep trenches. The lower capacitor node 310a is a heavily-doped n+ diffusion region formed by an arsenic-silicate-glass (ASG) film as a dopant diffusion source and can be formed by depositing an arsenic-silicate-glass film over a whole structure surface including sidewalls of the deep trenches, and a photoresist is formed and is then etched back to a level approximately equal to a bottom surface of the second-type second raised field-oxide layer 308c; and subsequently, the arsenic-silicate-glass film above the etched-back photoresist is removed by dipping in dilute hydrofluoric acid and the etched-back photoresist are then stripped; and thereafter, a thin capping silicon-dioxide layer is deposited over the formed structure surface including the arsenic-silicate-glass films formed in the lower portion of the deep trenches and the upper portion of the deep trenches, and a drive-in process is performed to form the lower capacitor nodes 310a; the thin capping silicon-dioxide layer and the arsenic-silicate-glass films are then removed by dipping in dilute hydrofluoric acid. It should be noted that the thin capping silicon-dioxide layer is mainly used to eliminate out-diffusion of dopant impurities in the arsenic-silicate-glass films during the drive-in process.

FIG. 3E also shows that a capacitor-dielectric layer 311 is formed over the formed structure surface and an upper capacitor node 312b is formed in each of the plurality of deep trenches. The capacitor-dielectric layer 311 is preferably a composite dielectric layer such as an oxide-nitride-oxide structure or a nitride-oxide (NO) structure. The upper capacitor node 312b is preferably made of doped polycrystalline-silicon and can be further implanted with a high dose of doping impurities of the second conductivity type (not shown), which is formed by first depositing a thick conductive layer 312 to fill up each gap in each of the plurality of scalable trench regions and then planarizing the deposited thick conductive layer 312 using CMP with the capacitor-dielectric layer 311 as a polishing stop to form planarized conductive layers 312a and thereafter etching back the planarized conductive layers 312a to a level approximately equal to a bottom surface of the second-type second raised field-oxide layers 308c to form the upper capacitor nodes 312b.

FIG. 3E further shows that the capacitor-dielectric layers 311 above the upper capacitor nodes 312b are removed preferably by wet-chemical solution and a collar-oxide spacer 313a together with a capacitor-node conductive layer 314b are formed in each of the plurality of deep trenches. The collar-oxide spacer 313a is formed by first depositing a silicon-dioxide film 313 over the formed structure surface and then etching back a thickness of the deposited silicon-dioxide film 313 to form a sidewall silicon-dioxide spacer 313a over each inner sidewall formed in each of the plurality of deep trenches; a planarized conductive layer 314a is then formed to fill up a gap formed in each of the plurality of scalable trench regions and is etched back to a predetermined depth to form a capacitor-node conductive connector layer 314b; and an ion-implantation can be performed by implanting doping impurities of the second conductivity type to heavily dope the capacitor-node conductive connector layer 314b.

Figure 3F:
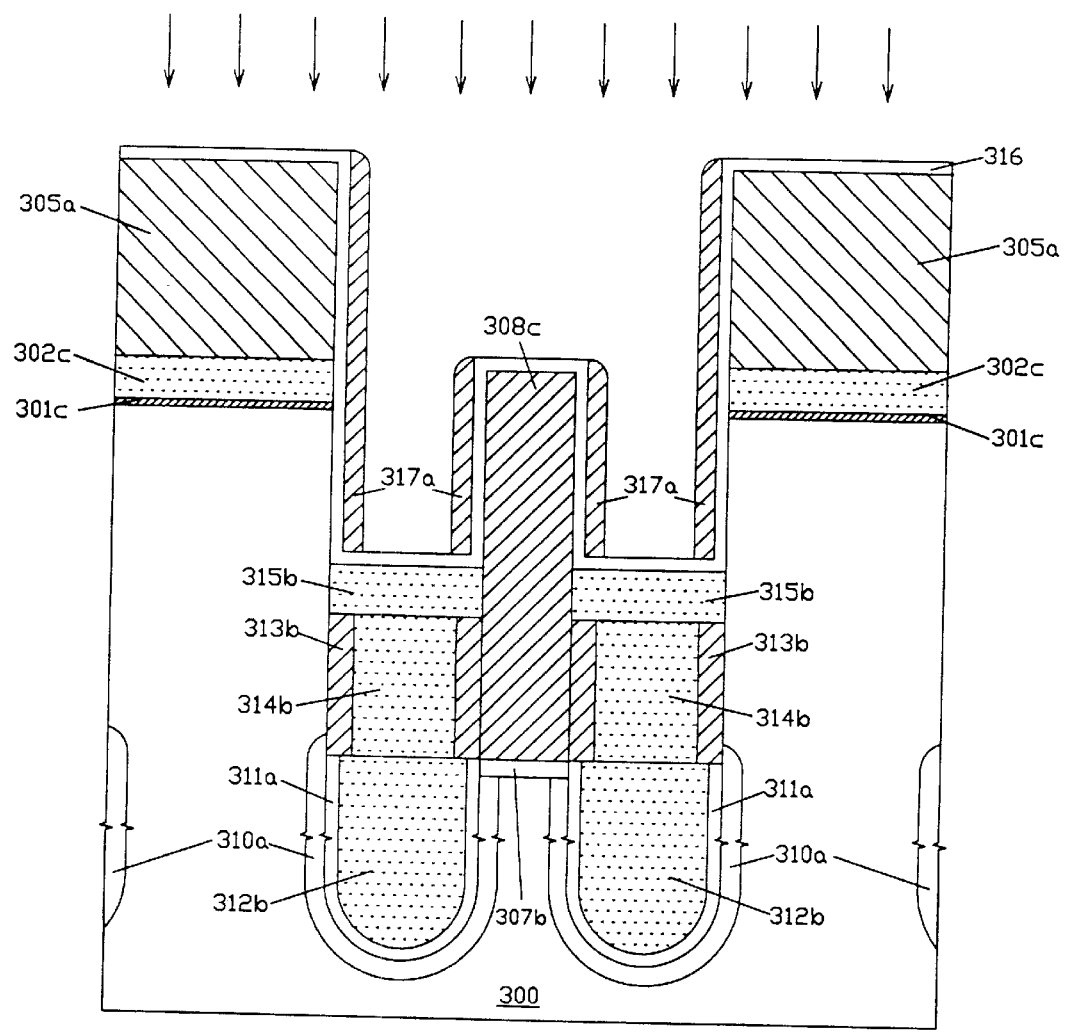

FIG. 3F shows that the sidewall silicon-dioxide spacers 313a above the capacitor-node conductive connector layer 314b in each of the plurality of deep trenches are removed, and a source conductive layer 315b is then formed over the collar-oxide layer 313b and the capacitor-node conductive connector layer 314b. The source conductive layer 315b is preferably made of doped polycrystalline-silicon or intrinsic polycrystalline-silicon and is formed by first depositing a thick conductive film 315 to fill up a gap formed in each of the plurality of scalable trench regions and then planarizing the deposited thick conductive layer 315 using CMP with the second masking dielectric layer 305a as a polishing stop to form a planarized conductive layer 315a in each of the plurality of scalable trench regions, and the planarized conductive layers 315a are then etched back to form the source conductive layers 315b.

FIG. 3F also shows that a thin capping silicon-dioxide layer 316 is formed over the formed structure surface; a thin capping silicon-nitride layer 317 is then formed over the thin capping silicon-dioxide layer 316 and is then etched back to a thickness of the deposited thin capping silicon-nitride layer 317 to form thin capping silicon-nitride spacers 317a over each sidewall of the thin capping silicon-dioxide layer 316 in each of the plurality of scalable trench regions; and an ion-implantation is performed by implanting a high dose of doping impurities of the second conductivity type across the thin capping silicon-dioxide layer 316 into the source conductive layers 315b. The thin capping silicon-dioxide layer 316 is preferably deposited by LPCVD or a high-temperature oxide (HTO) deposition and its thickness is preferably between 50 Angstroms and 150 Angstroms. The thin capping silicon-nitride layer 317 is preferably deposited by LPCVD and its thickness is preferably between 50 Angstroms 300 Angstroms. It should be noted that the thin capping silicon-dioxide layer 316 and the thin capping silicon-nitride layer 317 serve two purposes: a first purpose is to prevent the trench sidewall from ion-implantation; and a second purpose is to prevent the trench sidewall surface from oxidation and the stress-induced defects in a later process.

Figure 3G:
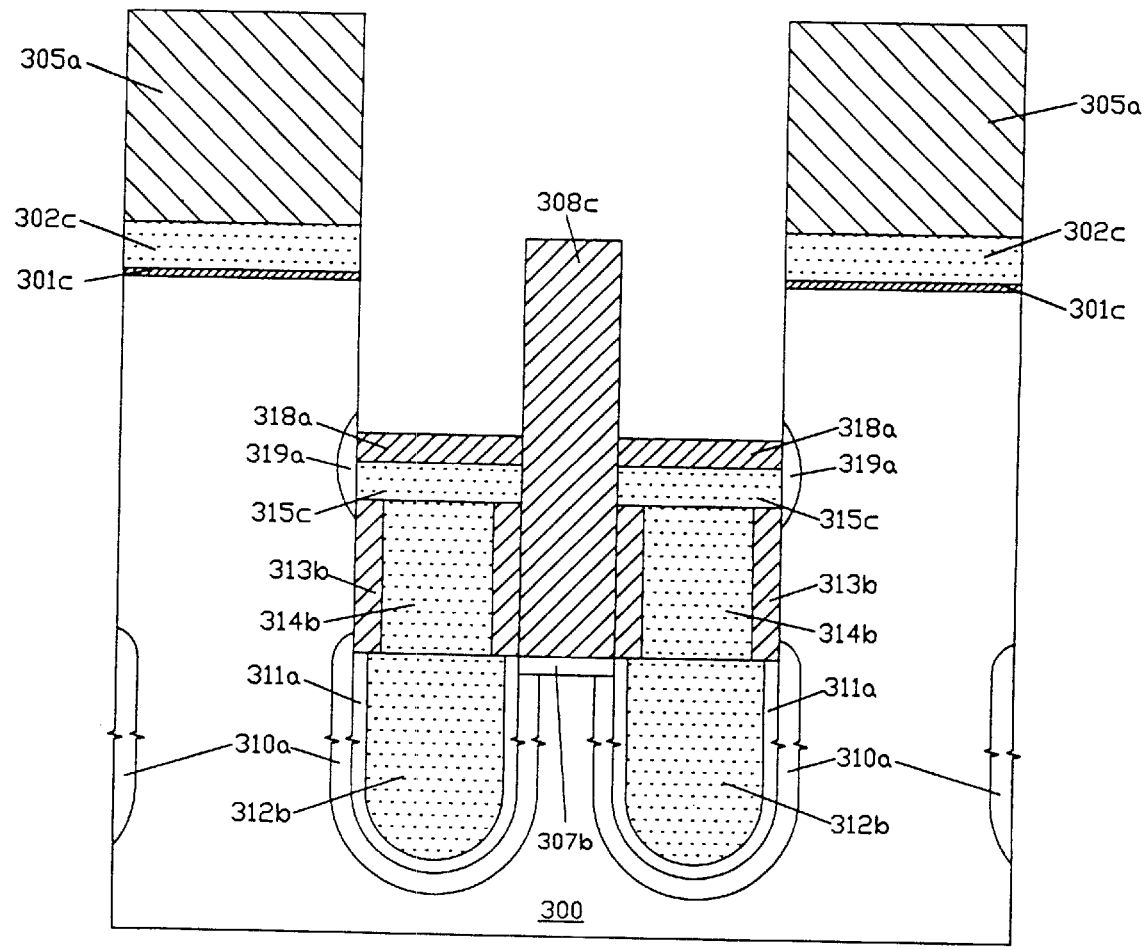

FIG. 3G shows that a thermal oxidation process is performed to form an isolation silicon-dioxide layer 318a over the source conductive layer 315b and the implanted doping impurities in the source conductive layer 315b are simultaneously diffused into a side portion of the semiconductor substrate 300 near the source conductive layer 315b to form a common-source diffusion region 319a; and subsequently, the thin capping silicon-nitride spacers 317a are removed by hot-phosphoric acid and then the thin capping silicon-dioxide layers 316 are selectively removed by dipping in a dilute hydrofluoric solution or using isotropic dry etching. The thickness of the isolation silicon-dioxide layer 318a is preferably between 500 Angstroms and 1500 Angstroms. Therefore, the thickness of the source conductive layer 315b is preferably between 1000 Angstroms and 1500 Angstroms.

Figure 3H:
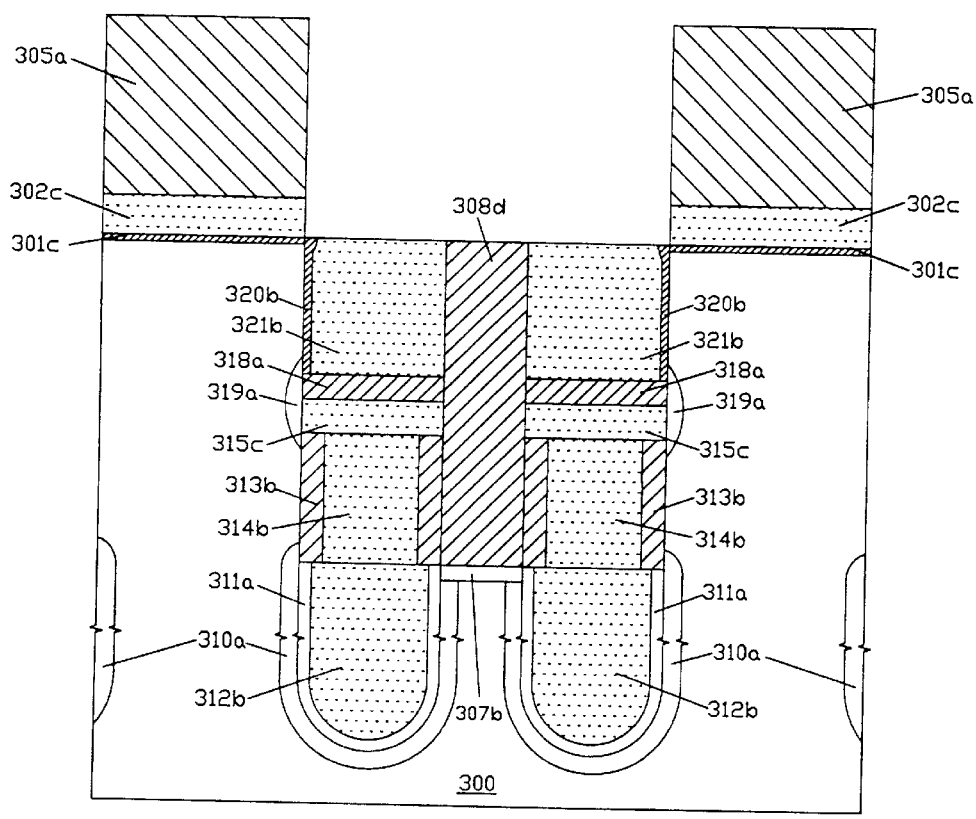

FIG. 3H shows that a gate-dielectric layer 320a is formed over each exposed trench sidewall by a well-known thermal oxidation process and a thicker poly-oxide layer is formed over each sidewall of the first conductive layers 302c; a planarized conductive layer 321a is formed to fill up a gap in each of the plurality of scalable trench regions and is then etched back to a depth approximately equal to a top surface level of the first dielectric layer 301c to form a conductive-gate layer 321b in each of the plurality of deep trenches; and subsequently, the first-type second raised field-oxide layers 304c, the second-type second raised field-oxide layers 308c, and the poly-oxide layers in each of the plurality of scalable trench regions are selectively etched to a top surface level of the conductive-gate layer 321b. The conductive-gate layer 321b is preferably made of doped polycrystalline-silicon as deposited by LPCVD and the planarized conductive layer 321a is planarized by using CMP with the second masking dielectric layer 305a as a polishing stop.

Figure 3I:
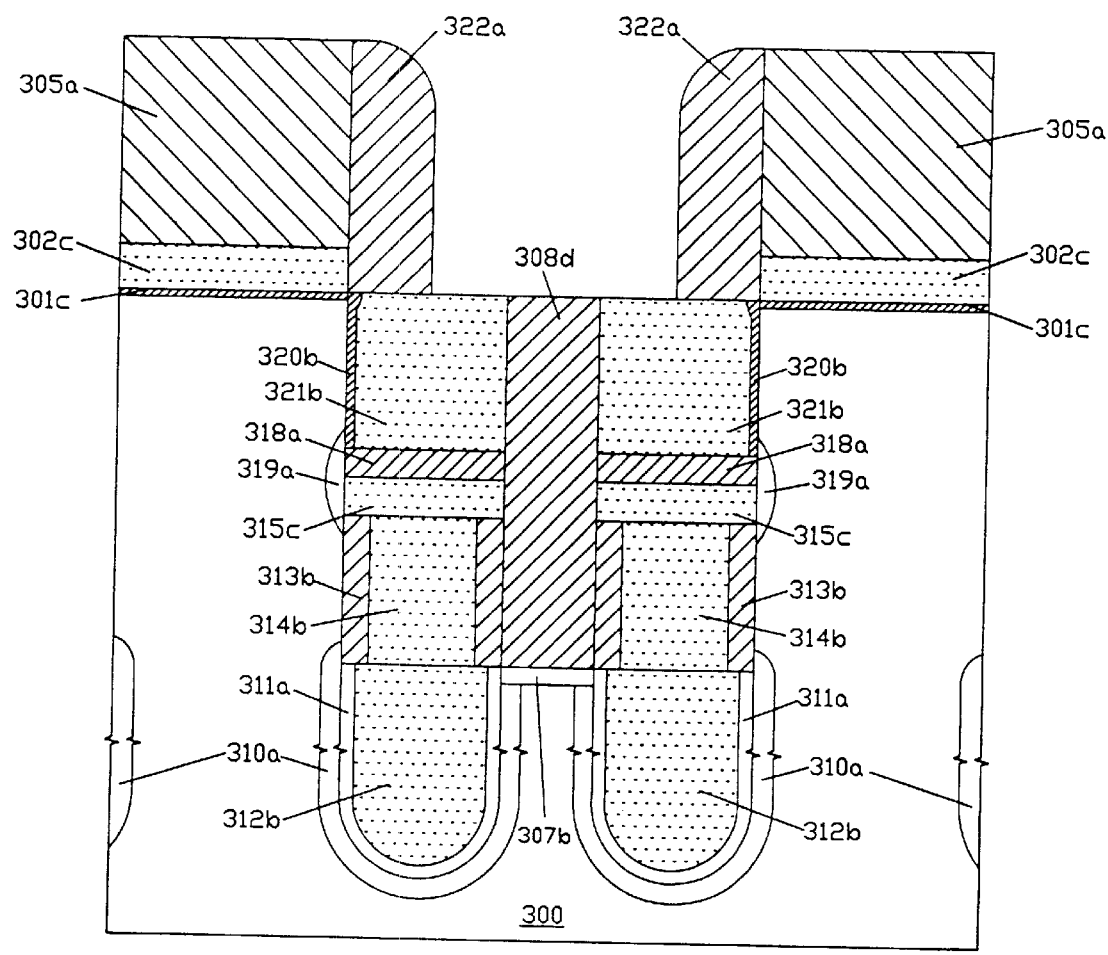

FIG. 3I shows that a pair of second sidewall dielectric spacers 322a are formed over outer sidewalls of nearby second masking dielectric layers 305a over the first conductive layers 302c and on a portion of the conductive-gate layers 321b and the first-type third raised field-oxide layers 304d in each of the plurality of scalable trench regions. The second sidewall dielectric spacer 322a is preferably made of silicon-dioxide as deposited by LPCVD.

Figure 3J:
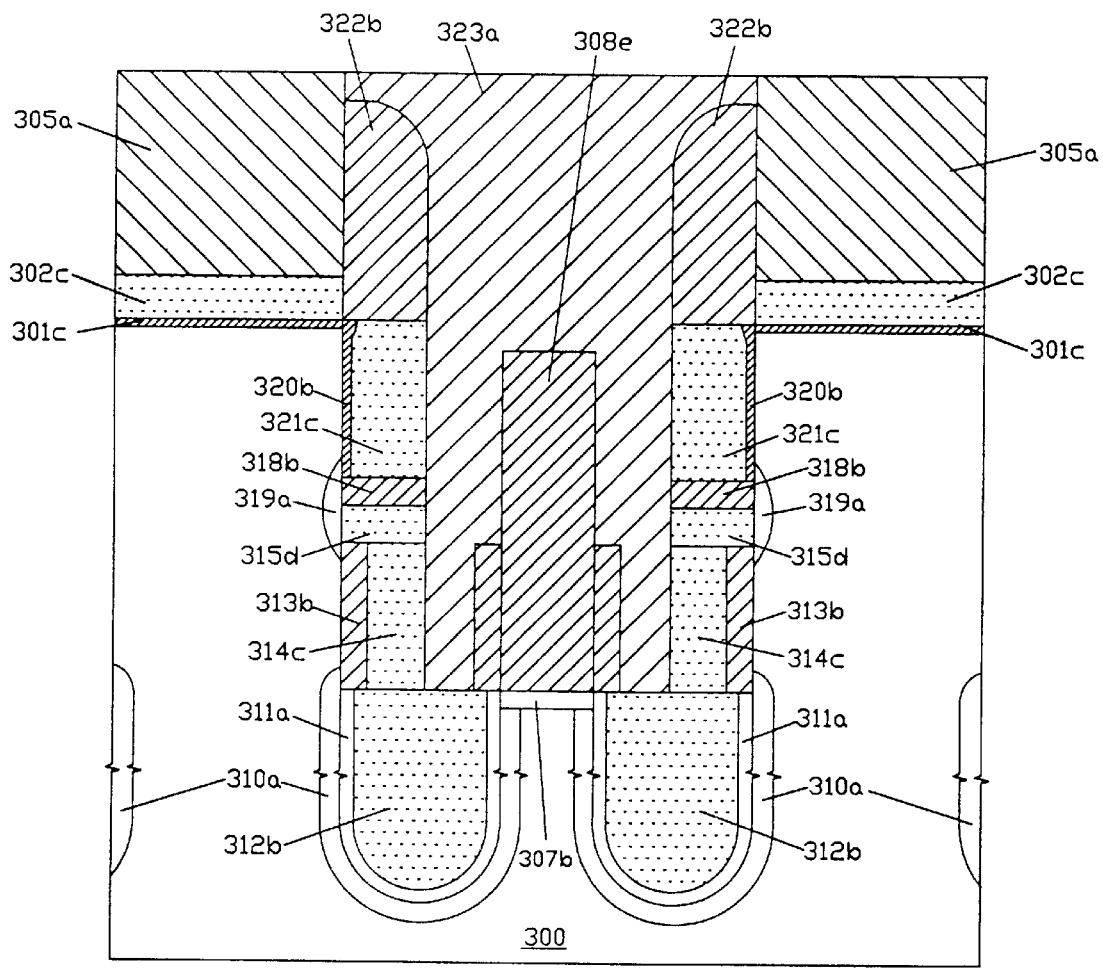

FIG. 3J shows that the conductive-gate layers 321b, the isolation silicon-dioxide layers 318a, the source conductive layers 315c, and the capacitor-node conductive connector layers 314b between the pair of second sidewall dielectric spacers 322a are sequentially removed to form conductive-gate nodes 321c, the isolation silicon-dioxide nodes 318b, source-conductive nodes 315d, and capacitor-node conductive connector 314c, respectively; and the second-type third raised field-oxide layers 308d and the first-type third raised field-oxide layers 304d between the pair of second sidewall dielectric spacers 322a and the pair of second sidewall dielectric spacers 322a are simultaneously etched during removing the isolation silicon-dioxide layers 318a. FIG. 3J also shows that a first planarized thick-oxide layer 323a is formed over a gap formed in each of the plurality of scalable trench regions. The first planarized thick-oxide layer 323a is preferably made of silicon-oxide, P-glass, or BP-glass as deposited by HDPCVD or PECVD and is formed by first depositing a thick-oxide film 323 to fill up a gap formed in each of the plurality of scalable trench regions and then planarizing the deposited thick-oxide film 323 using CMP with the second masking dielectric layer 305a as a polishing stop. It should be emphasized that a first masking structure of the present invention having a doped polycrystalline-silicon or amorphous-silicon layer 302 formed over a thin thermal-oxide or nitrided thermal-oxide layer 301 to act as a stress-relief buffer layer may reduce the undercut effect as compared to a pad-oxide layer used in the prior art and a thicker poly-oxide layer being formed over a sidewall of the first conductive layer 302c may reduce the overlapping capacitance between the conductive-gate node 321c and the drain.

Figure 3K:
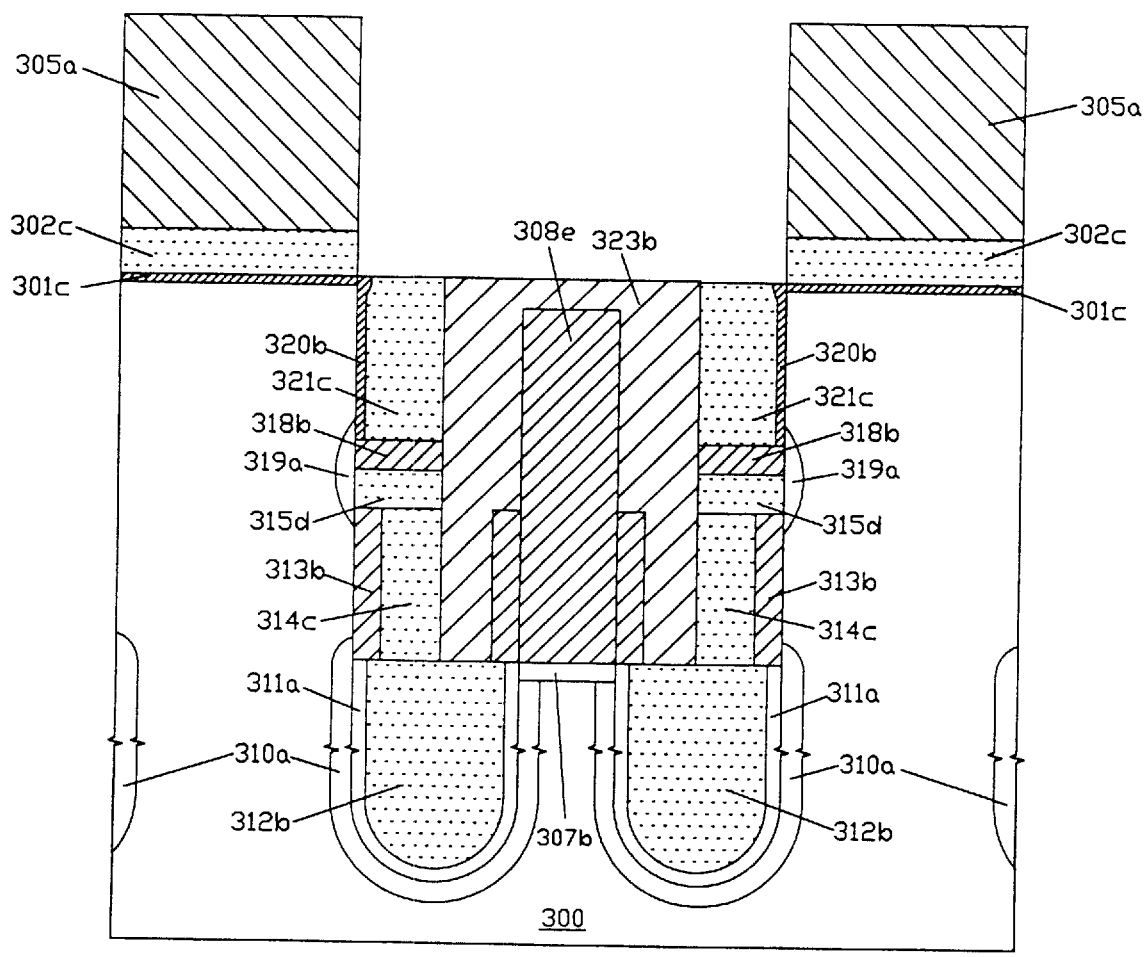

FIG. 3K shows that the first planarized thick-oxide layer 323a and the etched second sidewall dielectric spacers 322b in each of the plurality of scalable trench regions are etched back to a top surface level of the conductive-gate node 321c by anisotropic dry etching or wet chemical etching to form a flat surface being formed by the conductive-gate nodes 321c, the first-type third raised field-oxide layers 304d, and the etched-back first planarized thick-oxide layers 323b.

Referring now to FIG. 4A through FIG. 4E, there are shown the process steps and their cross-sectional views for forming a first-type scalable vertical DRAM cell structure and its first-type contactless DRAM array after FIG. 3K.

Figure 4A:
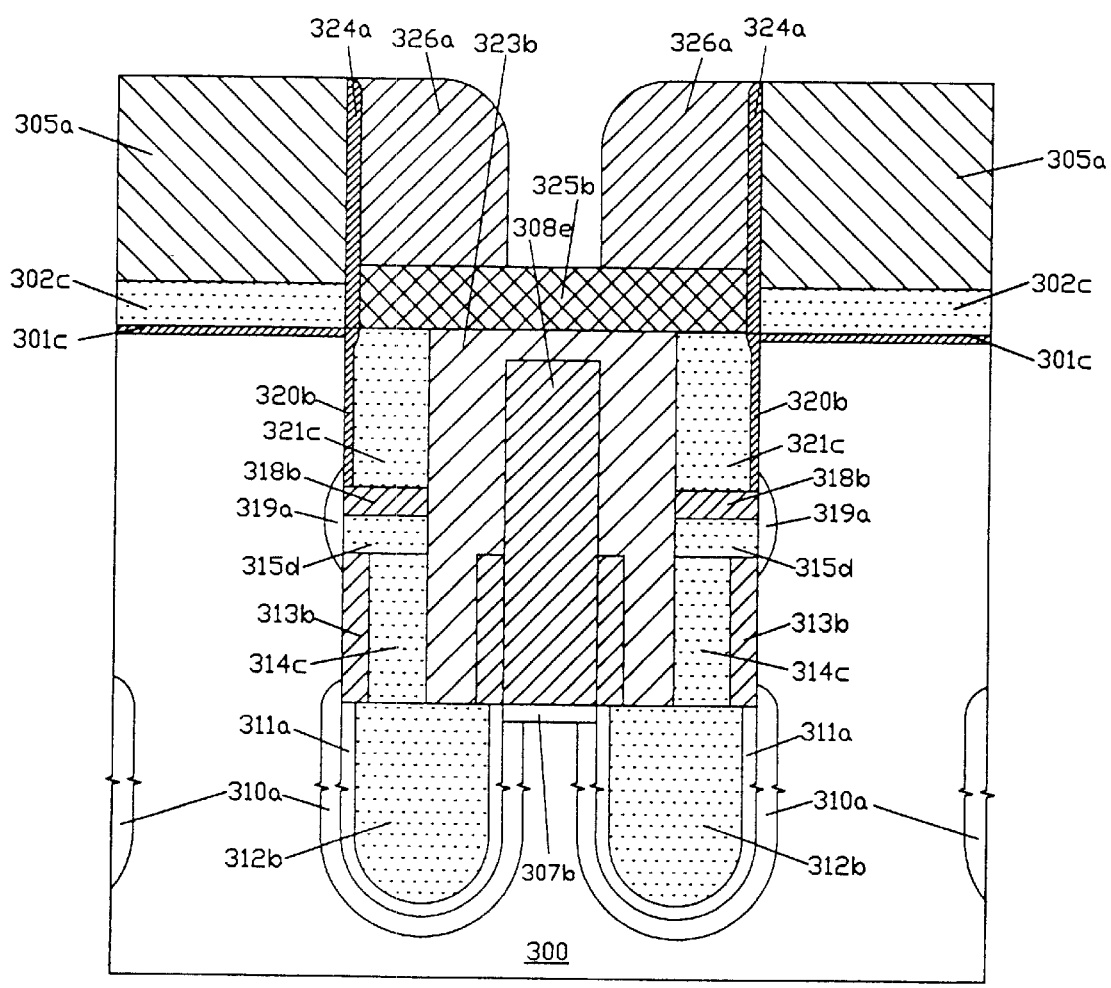
FIG. 4A through FIG. 4E show the process steps and their cross-sectional views of fabricating a first-type scalable vertical DRAM cell structure and its first-type contactless DRAM array of the present invention after FIG. 3K.

FIG. 4A shows that a pair of third sidewall dielectric spacers 324a are formed over outer sidewalls of nearby second masking dielectric layers 305a over the first conductive layers 302c; a capping conductive-gate layer 325b is formed between the pair of third sidewall dielectric spacers 324a and on a flat surface being formed by the conductive-gate nodes 321c, the first-type third raised field-oxide layers 304d, and the etched-back first planarized thick-oxide layer 323b in each of the plurality of scalable trench regions; and subsequently, a pair of fourth sidewall dielectric spacers 326a are formed over outer sidewalls of the pair of third sidewall dielectric spacers 324a and on the capping conductive-gate layer 325b in each of the plurality of scalable trench regions. The third sidewall dielectric spacer 324a is preferably made of silicon-dioxide as deposited by LPCVD and its spacer width is approximately equal to a thickness of the poly-oxide layer being formed over the first conductive layer 302c. The fourth sidewall dielectric spacer 326a is preferably made of silicon-dioxide as deposited by LPCVD and its spacer width is used to define the width of the capping conductive-gate layer 325c being acted as a conductive word-line. The capping conductive-gate layer 325b is preferably made of tungsten-silicide ($WSi_2$) or tungsten (W) as deposited by LPCVD or sputtering. It should be noted that the conductive-gate nodes 321c can be implanted with a high dose of doping impurities of the second conductivity type across the third dielectric layer 324 in a self-aligned manner before etching back the deposited dielectric layer 324 for forming the third sidewall dielectric spacer 324a.

Figure 4B:
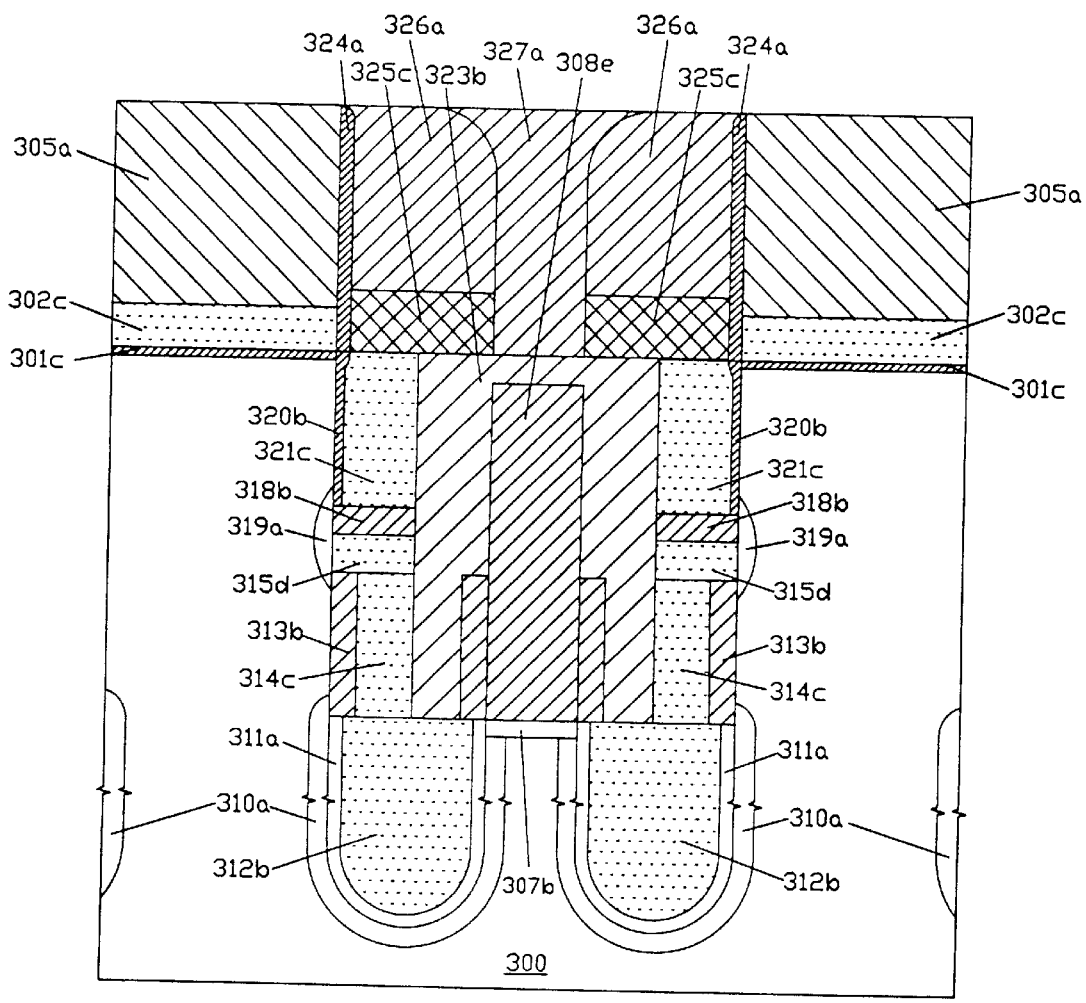

FIG. 4B shows that, the capping conductive-gate layer 325b between the pair of fourth sidewall dielectric spacers 326a are removed by using anisotropic dry etching to form a pair of conductive word-lines 325c in each of the plurality of scalable trench regions and a second planarized thick-oxide layer 327a is then formed between the pair of fourth sidewall dielectric spacers 326a. The second planarized thick-oxide layer 327a is preferably made of silicon-dioxide as deposited by LPCVD, HDPCVD, or PECVD. It is clearly seen that the width of the conductive word-line 325c is scalable and is mainly controlled by the spacer width of the fourth sidewall dielectric spacer 326a.

Figure 4C:
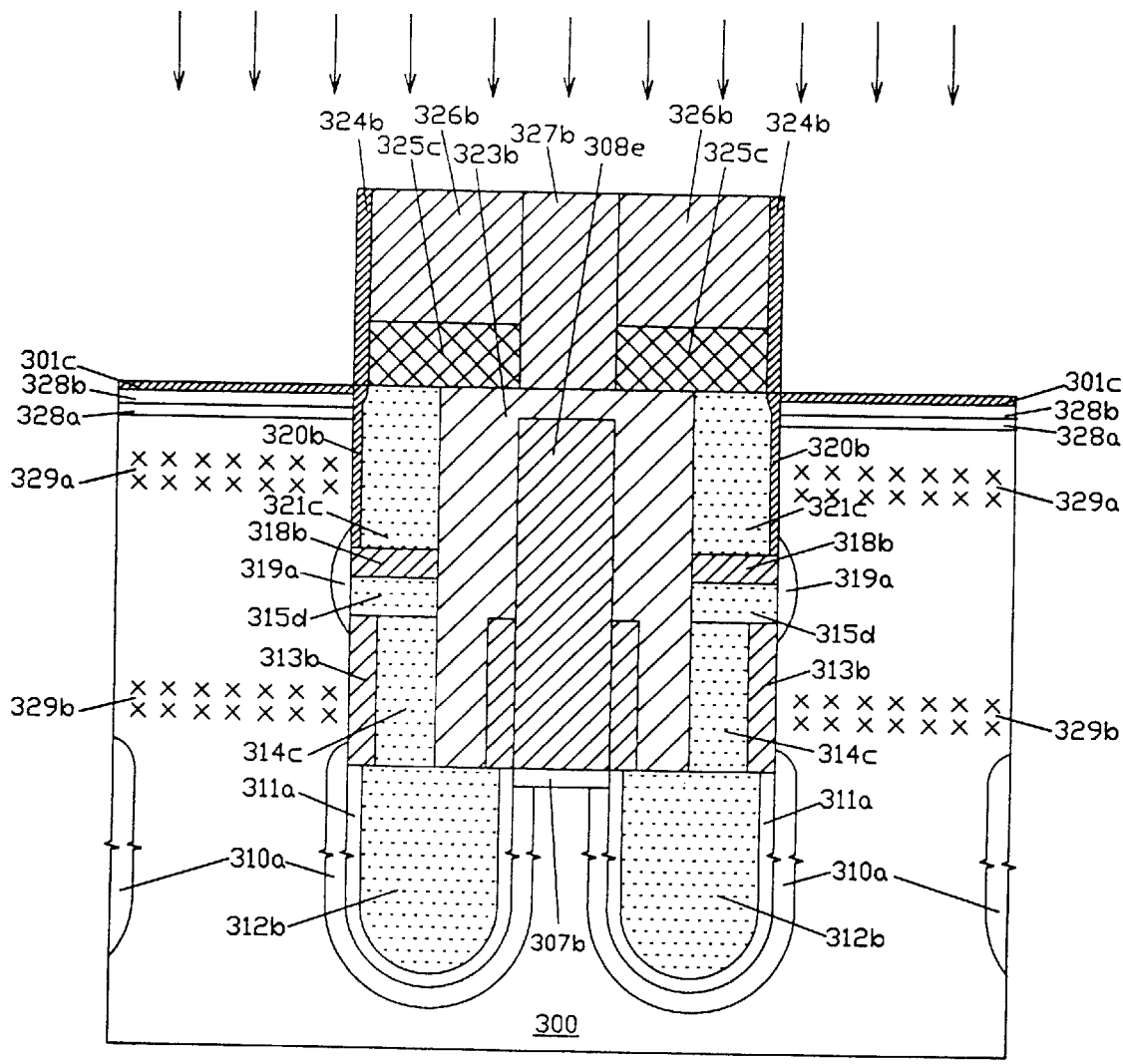

FIG. 4C shows that the second masking dielectric layer 305a in each of the plurality of self-aligned common-drain regions is selectively removed by hot-phosphoric acid or anisotropic dry etching, and the first-type first raised field-oxide layers 304b in each of the plurality of self-aligned common-drain regions and various silicon-dioxide layers in each of the plurality of scalable trench regions are etched back to a depth equal to a thickness of the first conductive layer 302c by using anisotropic dry etching; and subsequently, the first conductive layers 302c are selectively removed by using anisotropic dry etching, and different ion-implantations are preformed in a self-aligned manner by including a common-drain diffusion region 328a/328b of the second conductive type, a deep implant region 329a of the first conductivity type for both threshold-voltage adjustment and punch-through stop formation of the vertical transistor, and a deeper implant region 329b of the first conductivity type for forming a punch-through stop of the parasitic collar-oxide transistor in each of the plurality of active regions. The common-drain diffusion region 328a/328b comprises a shallow heavily-doped common-drain diffusion region 328b being formed within a lightly-doped common-drain diffusion region 328a. It is clearly seen that the gate length of the vertical transistor and the gate length of the parasitic collar-oxide transistor can be much reduced without concerning the short-channel effects produced by the vertical transistor and the parasitic collar-oxide transistor. As a consequence, the depth of the deep trenches can be made to be shallower by the present invention and the turn-on current of the vertical transistor can be made to be larger for a shorter channel length by the present invention.

Figure 4D:
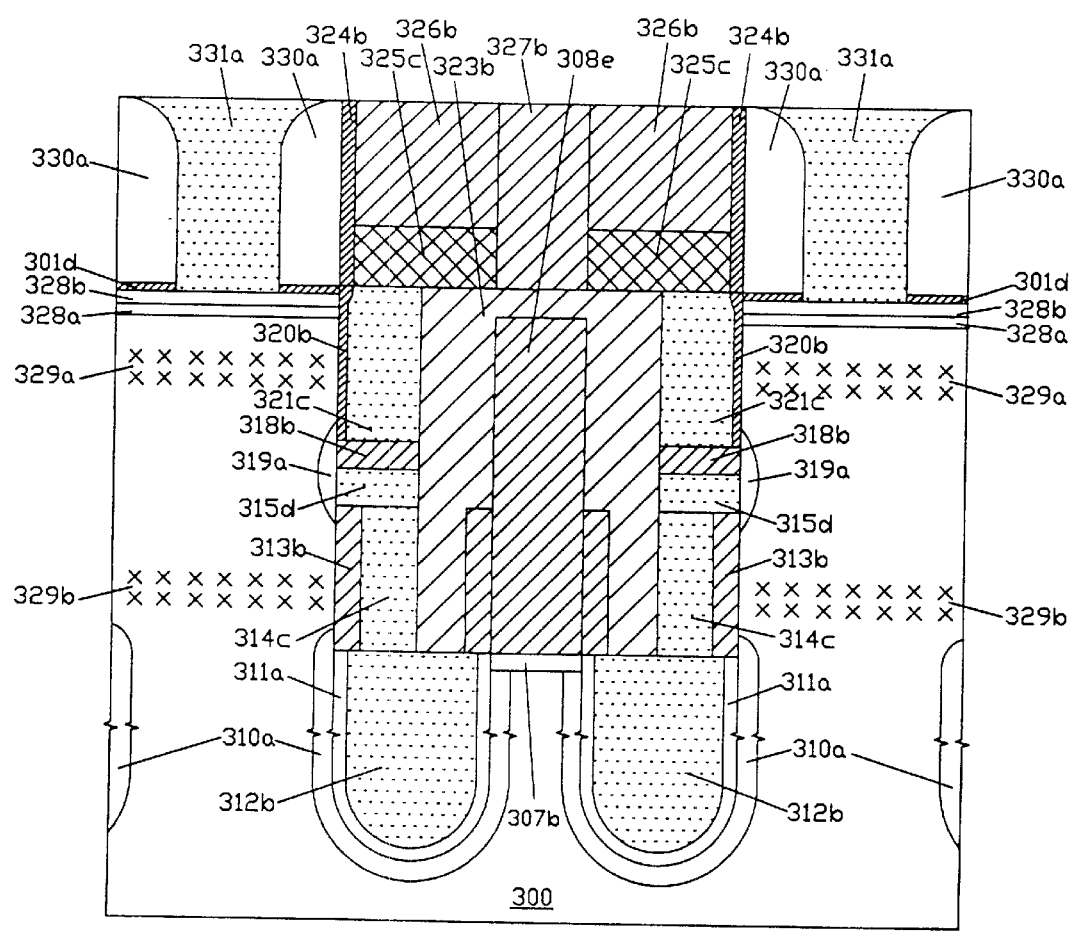

FIG. 4D shows that a pair of fifth sidewall dielectric spacers 330a are formed over outer sidewalls of nearby etched third sidewall dielectric spacers 324b, and the first dielectric layers 301c between the pair of fifth sidewall dielectric spacers 330a are removed and the first-type third raised field-oxide layers 304d are etched back to form first-type fourth raised field-oxide layers 304e; and subsequently, a planarized common-drain conductive layer 331a is formed over a flat bed between the pair of fifth sidewall dielectric spacers 330a in each of the plurality of self-aligned common-drain regions. The planarized common-drain conductive layer 331a is preferably made of doped polycrystalline-silicon and can be further implanted with a high dose of doping impurities of the second conductivity type, which can be formed by first depositing a thick conductive layer 331 to fill up a gap being formed between the pair of fifth sidewall dielectric spacers 330a and then planarizing by using CMP or etching back. The fifth sidewall dielectric spacer 330a is preferably made of silicon-oxide, silicon-nitride, or silicon-oxynitride as deposited by LPCVD. The flat bed is alternately formed by the shallow heavily-doped common-drain diffusion region 328b and the first-type fourth raised field-oxide layer 304e.

Figure 4E:
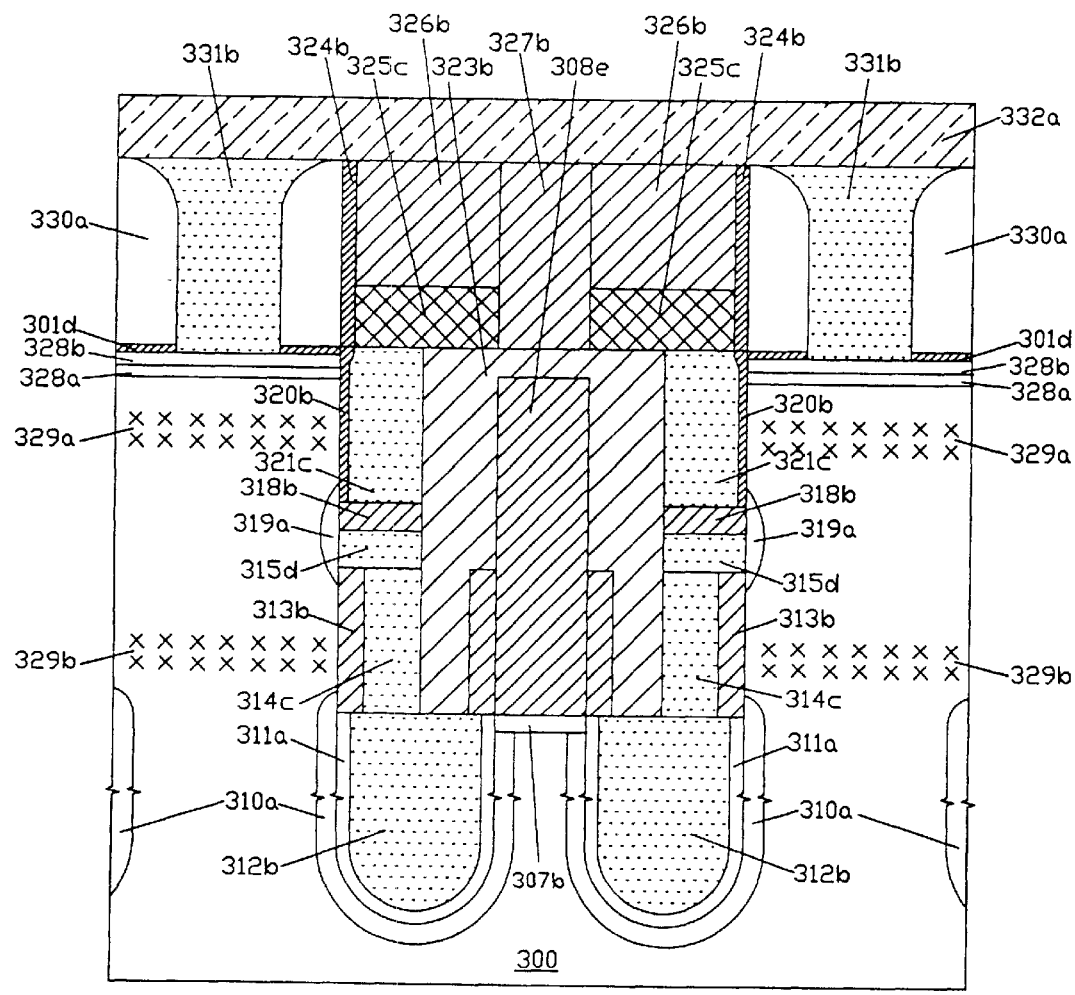

FIG. 4E shows that a metal layer 332 is formed over the planarized structure surface shown in FIG. 4D, and the metal layer 332 and the planarized common-drain conductive layers 331a are simultaneously patterned and etched to form a plurality of metal bit-lines 332a integrated with planarized common-drain conductive islands 331b by using a masking photoresist step. It should be noted that the planarized common-drain conductive island 331b may comprise a planarized heavily-doped polycrystalline-silicon island being silicided with a refractory metal-silicide layer such as a titanium-disilicide ($TiSi_2$) or cobalt-disilicide ($CoSi_2$) layer. The metal layer 332a may comprise an aluminum (Al) or copper (Cu) layer over a barrier-metal layer such as a titanium-nitride (TiN) or tantalum-nitride (TaN) layer. The masking photoresist step may comprise a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers to eliminate misalignment.

Referring now to FIG. 5A through FIG. 5F, there are shown the process steps and their cross-sectional views for forming a second-type scalable vertical DRAM cell structure and its second-type contactless DRAM array of the present invention after FIG. 3K.

Figure 5A:
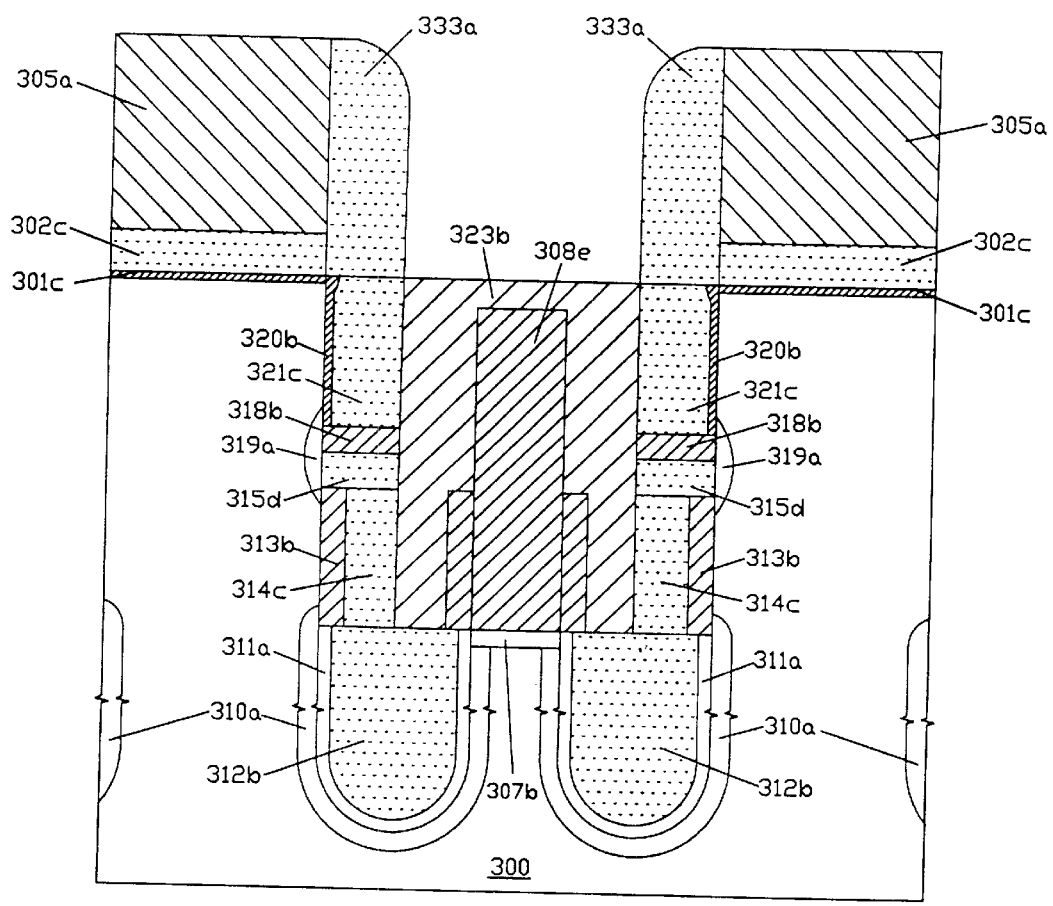
FIG. 5A through FIG. 5F show the process steps and their cross-sectional views of fabricating a second-type scalable vertical DRAM cell structure and its second-type contactless DRAM array of the present invention after FIG. 3K.

FIG. 5A shows that a pair of sidewall conductive spacers 333a are formed over outer sidewalls of nearby second masking dielectric layers 305a over the first conductive layers 302c and on the conductive-gate nodes 321c and the first-type third raised field-oxide layers 304d in each of the plurality of scalable trench regions.

Figure 5B:
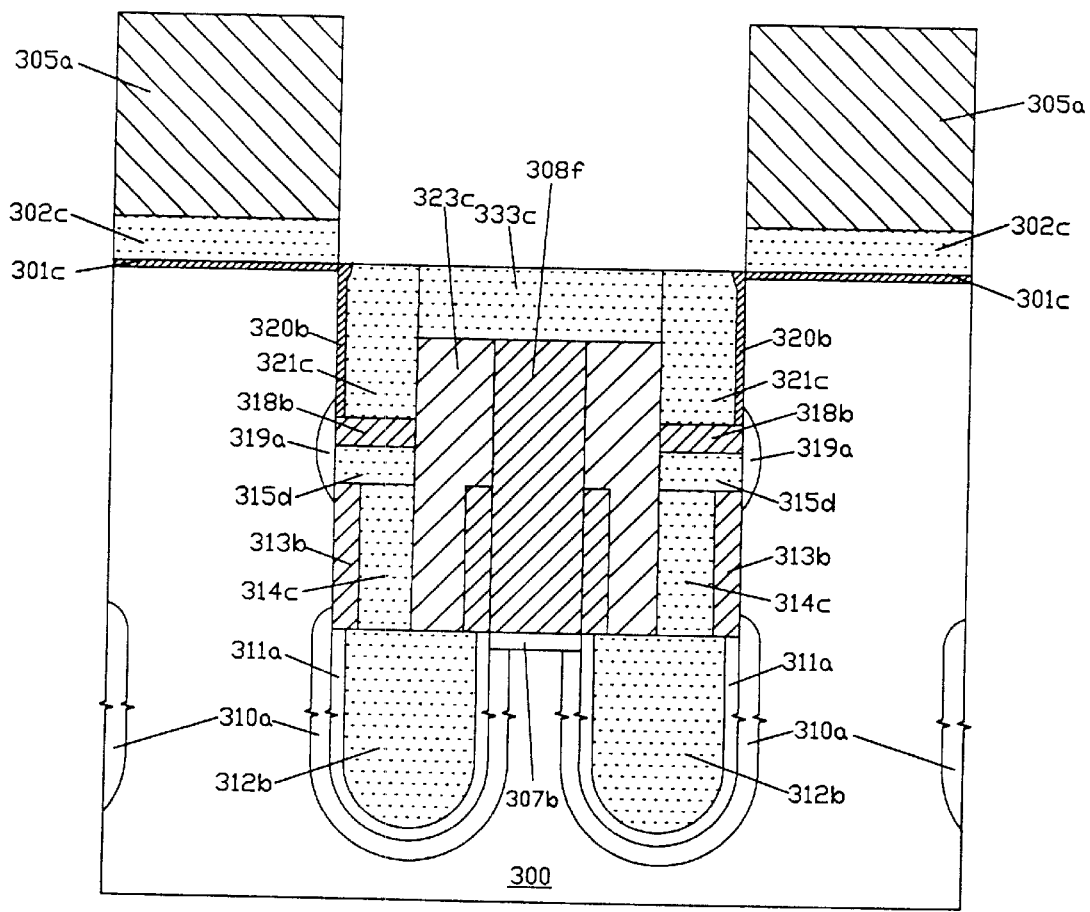

FIG. 5B shows that various silicon-dioxide layers between the pair of sidewall conductive spacers 333a are etched back to a depth approximately equal to a half thickness of the conductive-gate node 321c; a planarized conductive layer 333b is then formed between the pair of sidewall conductive spacers 333a; and subsequently, the pair of sidewall conductive spacers 333a and the planarized conductive layer 333b in each of the plurality of scalable trench regions are etched back anisotropically to a top surface level of the conductive-gate node 321c to form a common-gate conductive connector 333c. The sidewall conductive spacer 333a and the planarized conductive layer 333b are preferably made of doped polycrystalline-silicon as deposited by LPCVD.

Figure 5C:
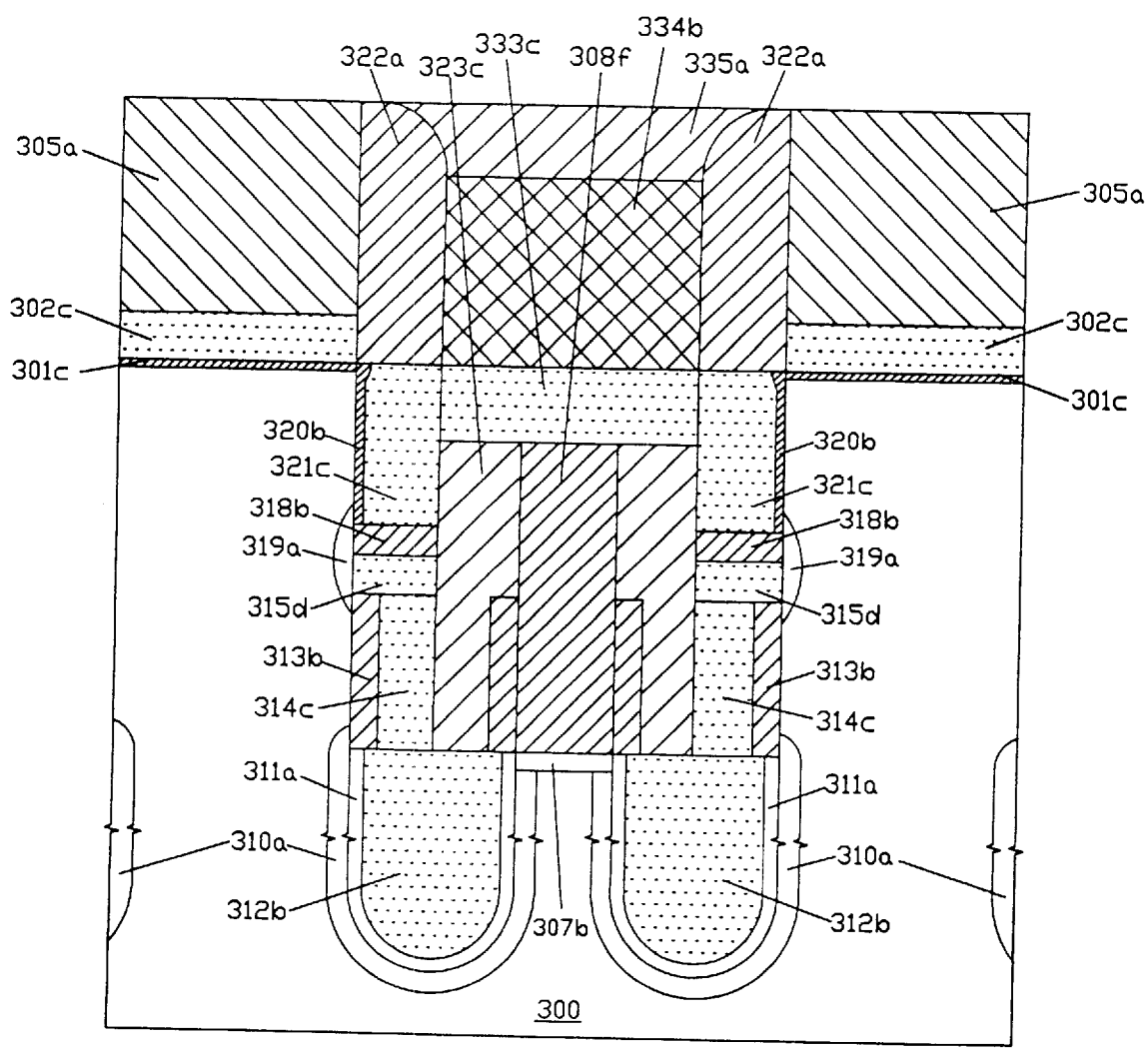

FIG. 5C shows that a pair of second sidewall dielectric spacers 322a are formed again over outer sidewalls of nearby second masking dielectric layers 305a over the first conductive layers 302c; and subsequently, a planarized capping conductive layer 334a is formed between the pair of second sidewall dielectric spacers 322a in each of the plurality of scalable trench regions and is then etched back to a depth slightly larger than a thickness of the first conductive layer 302c to form a planarized common-gate conductive layer 334b, and a planarized capping silicon-dioxide layer 335a is formed over the planarized common-gate conductive layer 334b in each of the plurality of scalable trench regions. The second sidewall dielectric spacer 322a is preferably made of silicon-oxide as deposited by LPCVD. The planarized capping conductive layer 334a is preferably made of tungsten-disilicide (WSi$_2$) or tungsten (W) as deposited by LPCVD or sputtering. It should be noted that the common-gate conductive connectors 333c can be further implanted with a high dose of doping impurities of the second conductivity type in a self-aligned manner after forming the pair of second sidewall dielectric spacers 322a.

Figure 5D:
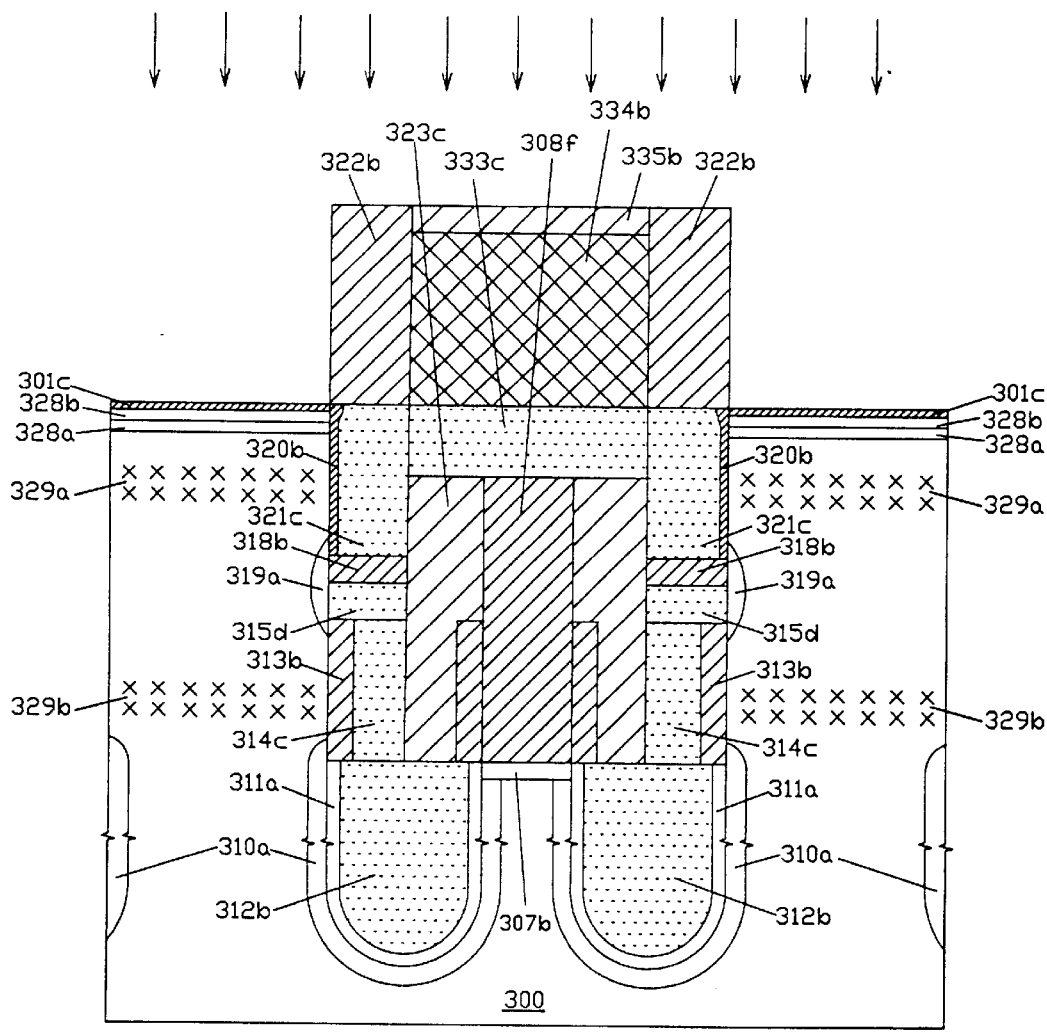

FIG. 5D shows that the second masking dielectric layer 305a in each of the plurality of self-aligned common-drain regions is selectively removed by using hot-phosphoric acid or anisotropic dry etching; and subsequently, the first-type first raised field-oxide layers 304b in each of the plurality of self-aligned common-drain regions together with the pair of second sidewall dielectric spacers 322a and the planarized capping silicon-dioxide layer 335a in each of the plurality of scalable trench regions are selectively etched back to a depth equal to a thickness of the first conductive layer 302c by using anisotropic dry etching, and the first conductive layers 302c in each of the plurality of self-aligned common-drain regions are then selectively removed by using anisotropic dry etching; and different ion-implantations are then performed to form a common-drain diffusion region 328a/328b, a deep implant region 329a, and a deeper implant region 329b in each of the plurality of active regions as described in FIG. 4C.

Figure 5E:
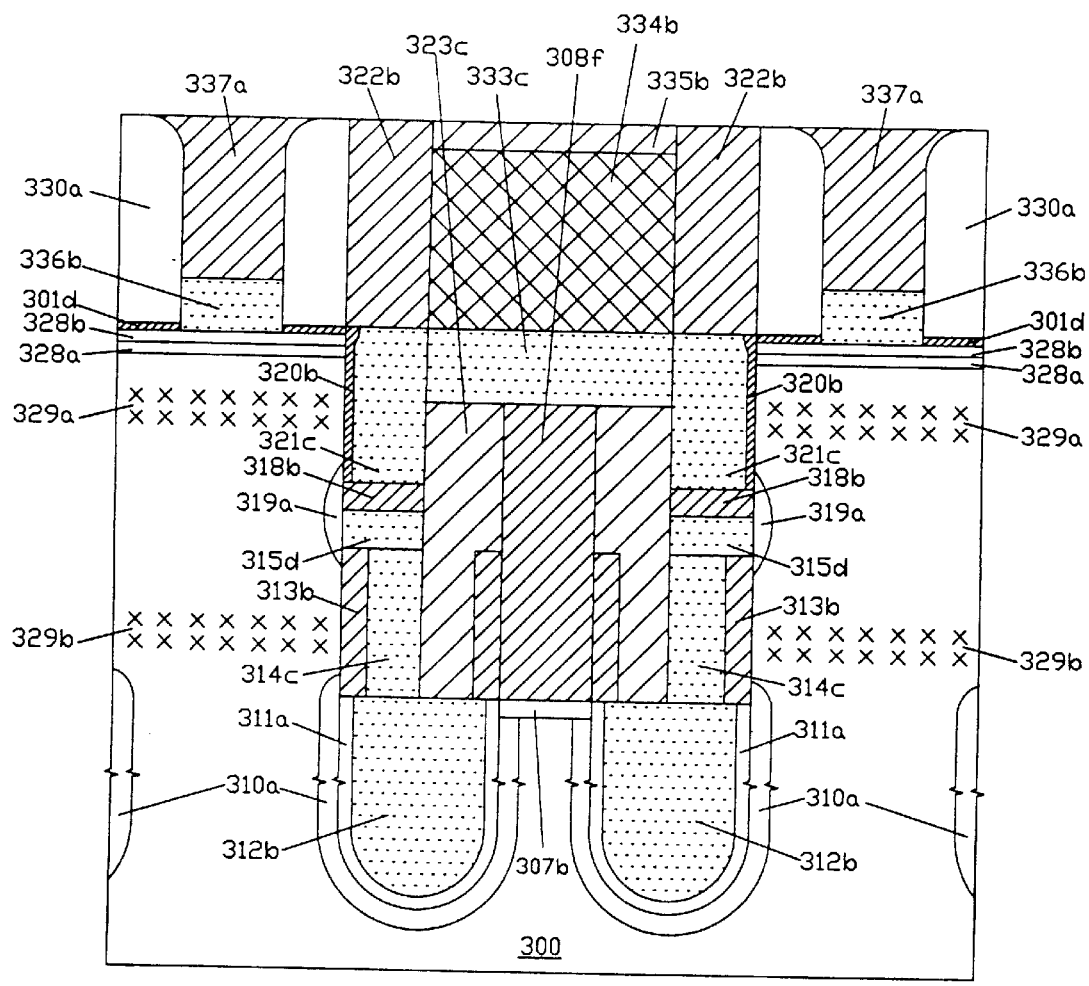

FIG. 5E shows that a pair of fifth sidewall dielectric spacers 330a are formed over outer sidewalls of nearby etched-back second sidewall dielectric spacers 322b, and the first dielectric layers 301c between the pair of fifth sidewall dielectric spacers 330a are then removed by dipping in dilute hydrofluoric acid or anisotropic dry etching; and subsequently, a common-drain conductive bus-line 336b is formed over a flat bed between the pair of fifth sidewall dielectric spacers 330a, and a third planarized thick-oxide layer 337a is formed over the common-drain conductive bus-line 336b in each of the plurality of self-aligned common-drain regions. The fifth sidewall dielectric spacer 330a is preferably made of silicon-dioxide, silicon-nitride, or silicon-oxynitride as deposited by LPCVD. The flat bed is alternately formed by the shallow heavily-doped common-drain diffusion region 328b and the first-type fourth raised field-oxide layer 304e. The common-drain conductive bus-line 336b is preferably made of doped polycrystalline-silicon and is implanted with a high dose of doping impurities of the second conductivity type, and can be a heavily-doped polycrystalline-silicon layer silicided with a refractory metal-silicide layer or capped with a tungsten-disilicide or tungsten layer for forming a highly conductive common-drain bit-line in each of the plurality of self-aligned common-drain regions.

Figure 5F:
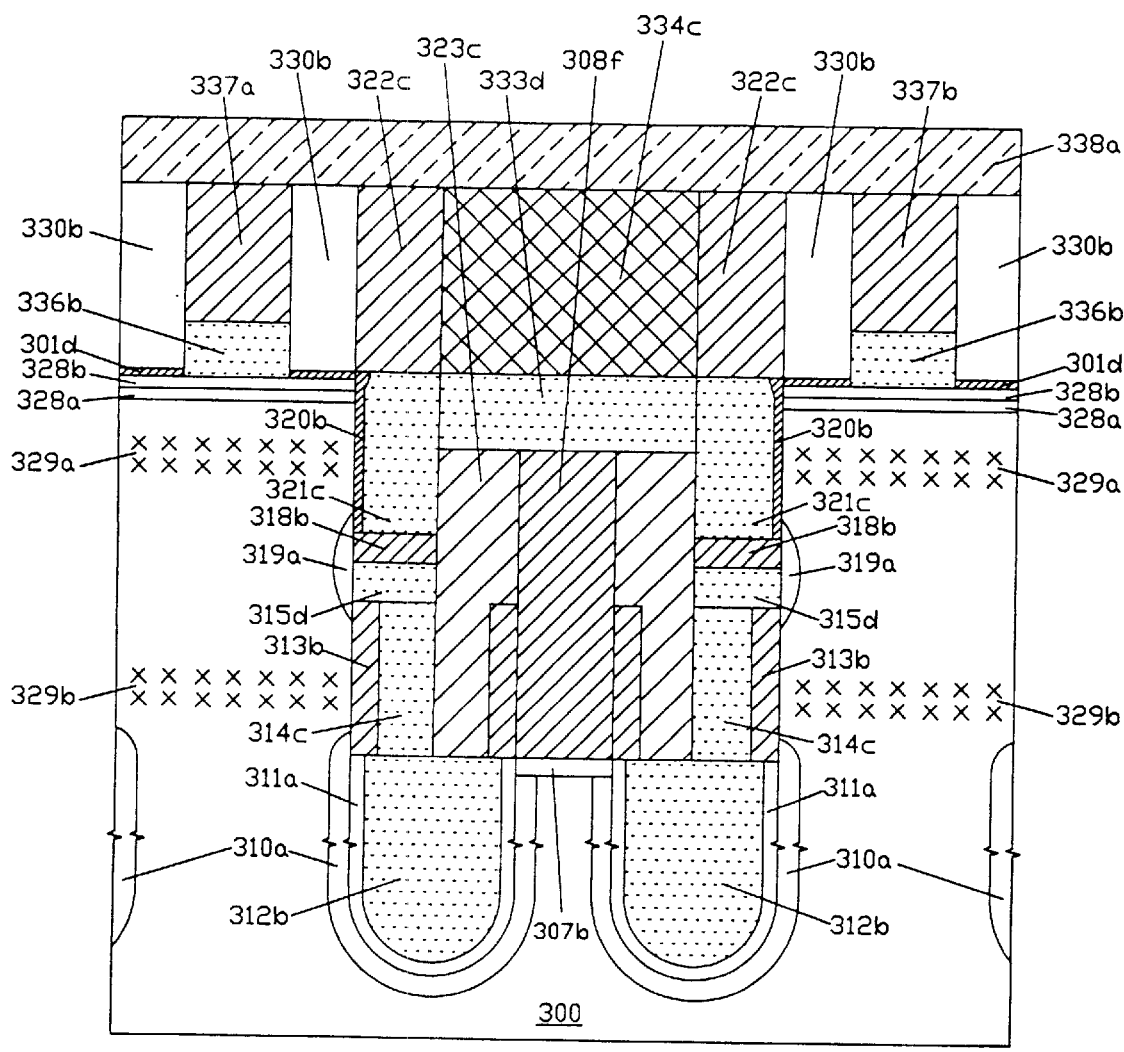

FIG. 5F shows that the pair of fifth sidewall dielectric spacers 330a and the third planarized thick-oxide layer 337a in each of the plurality of self-aligned common-drain regions and the pair of etched-back second sidewall dielectric spacers 322b and the etched-back planarized capping silicon-dioxide layer 335b in each of the plurality of scalable trench regions are etched back to a depth equal to a thickness of the etched-back planarized capping silicon-dioxide layer 335b; and subsequently, a metal layer 338 is formed over the etched-back flat surface and the metal layer 338 together with the planarized common-gate conductive layers 334b over the common-gate conductive connectors 333c are simultaneously patterned and etched to form a plurality of metal word-lines 338a integrated with planarized common-gate conductive islands 334c over common-gate conductive connector islands 333d by using a masking photoresist step. The metal layer 338 may comprise an aluminum or copper layer being formed over a barrier-metal layer. The masking photoresist step may comprise a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers.

Figure 6A:
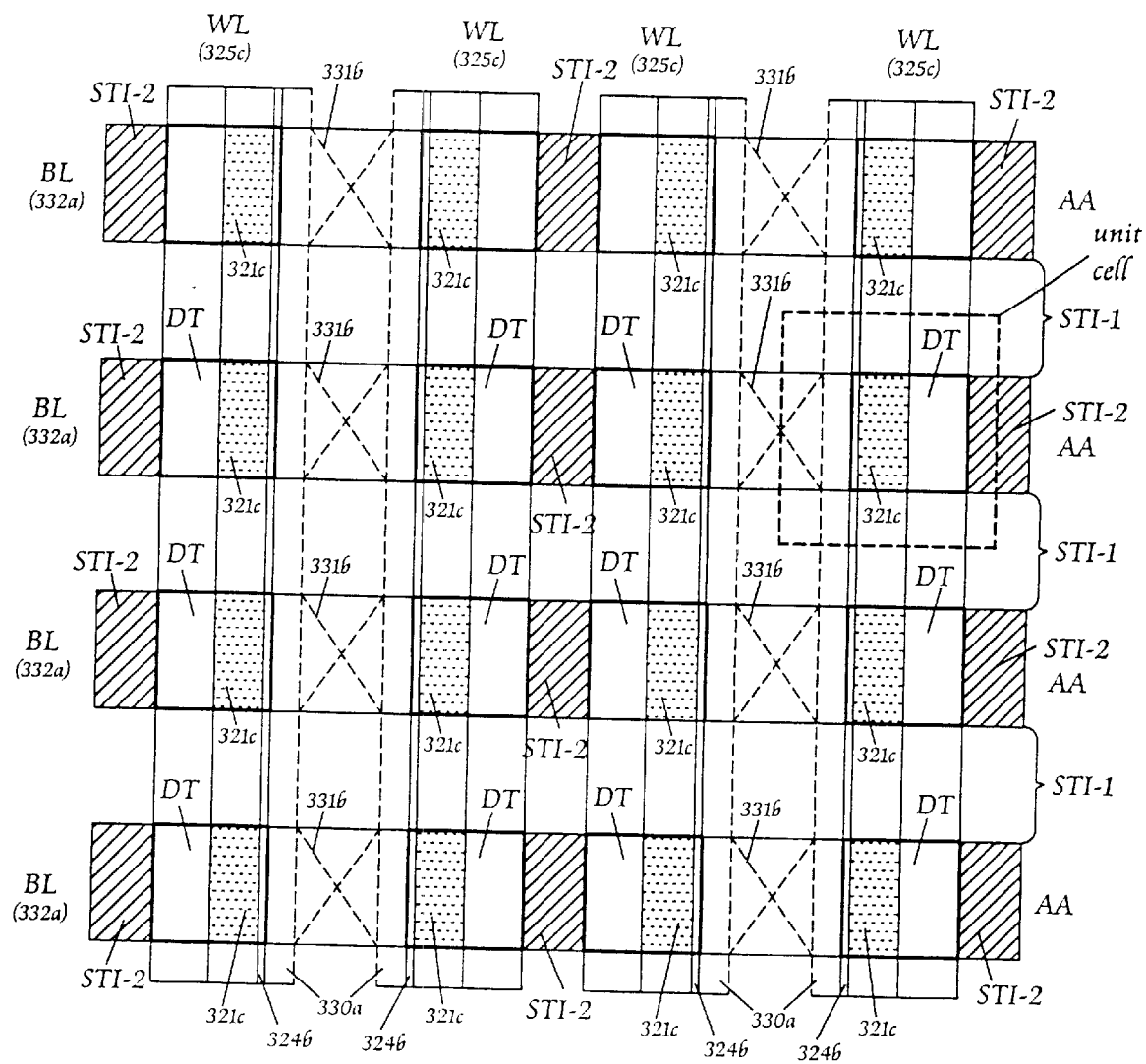
FIG. 6A shows a top plan view of a first-type contactless DRAM array of the present invention.

FIG. 6A shows a top plan view of the first-type contactless DRAM array of the present invention, in which a plurality of metal bit-lines (BL) 332a integrated with planarized common-drain conductive islands 331b are formed transversely to a plurality of conductive word-lines (WL) 325c; a plurality of first-type STI regions (STI-1) and a plurality of active regions (AA) are formed alternately and are located transversely to the plurality of conductive word-lines (WL) 325c; a second-type STI region (STI-2) is formed between a pair of deep trenches (DT); and each of the plurality of conductive word-lines 325c is integrated with the conductive-gate nodes 321c in each of the plurality of deep trenches (DT) being formed outside of an etched-back third sidewall dielectric spacer 324b. The unit cell size of a first-type scalable vertical DRAM cell structure of the present invention as masked by a dash square is scalable and can be made to be equal to or smaller than 4F$^2$.

Figure 6B:
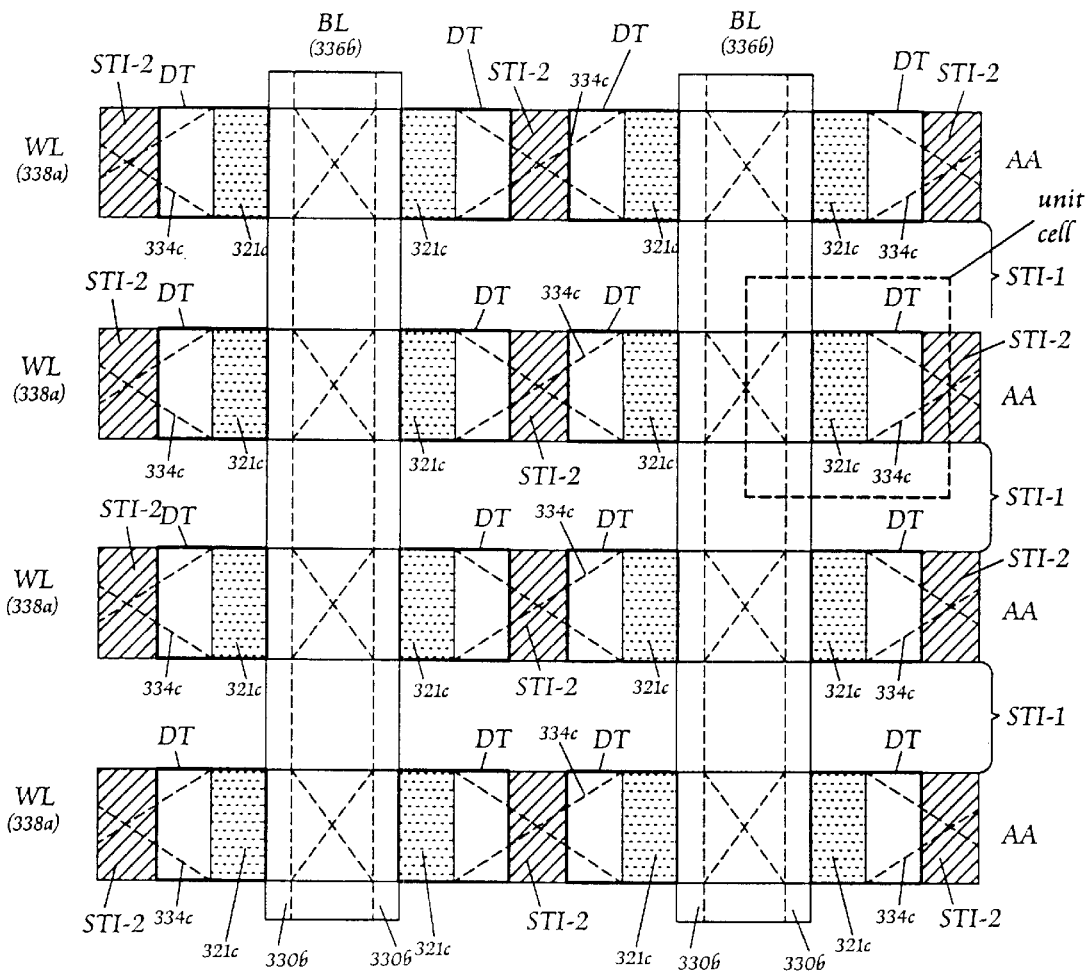
FIG. 6B shows a top plan view of a second-type contactless DRAM array of the present invention.

FIG. 6B shows a top plan view of the second-type contactless DRAM array of the present invention, in which a plurality of metal word-lines (WL) 338a integrated with planarized common-gate conductive islands 334c over common-gate conductive connector islands 333*d* are formed transversely to a plurality of common-drain conductive bit-lines (BL) 336*b;* a plurality of first-type STI regions (STI-1) and a plurality of active regions (AA) are formed alternately and are located transversely to the plurality of common-drain conductive bit-lines (BL) 336*b;* a second-type STI region (STI-2) is formed between a pair of deep trenches (DT); and the planarized common-gate conductive island 334*c* is connected with a side portion of the conductive-gate nodes 321*c* in nearby deep trenches through the common-gate conductive connector island 333*d.* The unit cell size of a second-type scalable vertical DRAM cell structure of the present invention as marked by a dash square is also scalable and can be made to be equal to or smaller than $4F^2$.

Accordingly, the advantages and the features of a scalable vertical DRAM cell structure and its contactless DRAM arrays of the present invention can be summarized below:

(a) The scalable vertical DRAM cell structure of the present invention can offer a scalable cell size equal to or smaller than $4F^2$ using a scalable trench region being defined by a first sidewall dielectric spacer.

(b) The scalable vertical DRAM cell structure of the present invention can be fabricated by using self-aligned techniques with less critical masking photoresist steps as compared to the prior art.

(c) The scalable vertical DRAM cell structure of the present invention can offer different implanted regions in a self-aligned manner for efficiently forming punch-through stops and adjusting threshold voltages of both vertical transistor and parasitic collar-oxide transistor so the depth of the deep trenches can be made to be shallower as compared to the prior art.

(d) The first-type contactless DRAM array of the present invention can offer a plurality of metal bit-lines integrated with planarized common-drain conductive islands and a plurality of conductive word-lines with a scalable word-line width for high-speed read and write operations.

(e) The second-type contactless DRAM array of the present invention can offer a plurality of metal word-lines integrated with planarized common-gate conductive islands over common-gate conductive connector islands and a plurality of conductive bit-lines for high-speed read and write operations.

While the present invention has been particularly shown and described with references to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A scalable vertical DRAM cell structure, comprising:
   a semiconductor substrate of a first conductivity type having an active region and two first-type shallow-trench-isolation (STI) regions, wherein said active region is located between said two first-type STI regions;
   a DRAM cell comprising a scalable trench region and a self-aligned common-drain region being formed on said semiconductor substrate, wherein said scalable trench region comprises a deep-trench region and a second-type STI region outside of said deep-trench region being located in said active region;
   said deep-trench region being defined by a first sidewall dielectric spacer formed over an outer sidewall of said self-aligned common-drain region comprising: a trench capacitor being formed in a lower portion of a deep trench, a collar-oxide layer together with a capacitor-node connector being formed in a middle portion of said deep trench, and a vertical transistor region being formed in an upper portion of said deep trench;
   said trench capacitor comprising an upper capacitor node being formed over a capacitor-dielectric layer and said capacitor-dielectric layer being formed over a lower capacitor node in said semiconductor substrate;
   said vertical transistor region comprising: a gate-dielectric layer over a portion of a sidewall of said deep trench together with a conductive-gate node being formed over an isolation silicon-dioxide node, said isolation silicon-dioxide node being formed over a source conductive node, and said source conductive node being formed over said capacitor-node connector and a portion of said collar-oxide layer to act as a dopant diffusion source for forming a common-source diffusion region in said semiconductor substrate near an outer portion of said source conductive node, wherein said conductive-gate node, said isolation silicon-dioxide node, said source conductive node, and said capacitor-node connector are patterned by a second sidewall dielectric spacer being formed over an outer sidewall of said self-aligned common-drain region; and
   said self-aligned common-drain region being located in a side portion of said scalable trench region comprising: a common-drain diffusion region of said second conductivity type being formed in an upper portion of said semiconductor substrate; in said active region, a fifth sidewall dielectric spacer being formed over an outer sidewall of said scalable trench region, and a flat bed being located outside of said fifth sidewall dielectric spacer and formed by a common-drain diffusion region of said second conductivity type in said active region and two first-type fourth raised field-oxide layers in said two first-type STI regions, wherein said active regions under said common-drain diffusion region comprises a deep implant region of said first conductivity type being formed in said semiconductor substrate near a middle portion outside of said gate-dielectric layer in said vertical transistor region, said common-source diffusion region of said second conductivity type being formed in said semiconductor substrate near an outer portion of said source conductive node, and a deeper implant region of said first conductivity type being formed in said semiconductor substrate near a middle portion outside of said collar-oxide layer.

2. The scalable vertical DRAM cell structure according to claim 1, wherein a planarized common-drain conductive island is formed over said common-drain diffusion region outside of said fifth sidewall dielectric spacer and a metal bit-line integrated with said planarized common-drain conductive island are simultaneously patterned by a masking photoresist step being aligned above said active region for forming a first-type scalable vertical DRAM cell.

3. The scalable vertical DRAM cell structure according to claim 1, wherein a common-drain conductive bus-line being acted as a conductive bit-line is formed over said flat bed outside of said fifth sidewall dielectric spacer and an etched-back third planarized thick-oxide layer is formed over said common-drain conductive bus-line for forming a second-type scalable vertical DRAM cell.

4. The scalable vertical DRAM cell structure according to claim 1, wherein a capping conductive-gate layer being formed outside of a third sidewall dielectric spacer and defined by a fourth sidewall dielectric spacer formed over an outer sidewall of said third sidewall dielectric spacer to act as a conductive word-line is formed over said conductive-gate node in said deep trench for forming a first-type scalable vertical DRAM cell.

5. The scalable vertical DRAM cell structure according to claim 1, wherein a common-gate conductive connector island is connected with a side portion of said conductive-gate node in said deep trench and a metal word-line integrated with planarized common-gate conductive island over said common-gate conductive connector island are simultaneously patterned by a masking photoresist step being aligned above said active region for forming a second-type scalable vertical DRAM cell.

6. The scalable vertical DRAM cell structure according to claim 1, wherein a bottom surface level of said second-type STI region is approximately equal to that of said collar-oxide layer and a heavily-implanted region of said second conductivity type is formed in said semiconductor substrate under said second-type STI region and is connected with said lower capacitor node being formed by a heavily-doped diffusion region of said second conductivity type.

7. A contactless DRAM array, comprising:

a semiconductor substrate of a first conductivity type having a plurality of active regions and a plurality of first-type shallow-trench-isolation (STI) regions formed alternately;

a plurality of scalable trench regions and a plurality of self-aligned common-drain regions being formed alternately on said semiconductor substrate and transversely to the plurality of active regions, wherein each of the plurality of scalable trench regions comprises a plurality of paired deep-trench regions and a plurality of second-type STI regions being formed between the plurality of paired deep-trench regions in the plurality of active regions;

the plurality of paired deep-trench regions being defined by a pair of first sidewall dielectric spacers formed over outer sidewalls of nearby self-aligned common-drain regions in each of the plurality of scalable trench regions, wherein said deep-trench region comprises: a trench capacitor being formed in a lower portion of a deep trench, a collar-oxide layer together with a capacitor-node connector being formed in a middle portion of said deep trench, and a vertical transistor region being formed in an upper portion of said deep trench;

said trench capacitor comprising an upper capacitor node being formed over a capacitor-dielectric layer and said capacitor-dielectric layer being formed over a lower capacitor node in said semiconductor substrate;

said vertical transistor region comprising a gate-dielectric layer over a portion of a sidewall of said deep trench together with a conductive-gate node being formed over an isolation silicon-dioxide node, said isolation silicon-dioxide node being formed over a source conductive node, and said source conductive node being formed over said capacitor-node connector and a portion of said collar-oxide layer to act as a dopant diffusion source for forming a common-source diffusion region in said semiconductor substrate near an outer portion of said source conductive node, wherein said conductive-gate node, said isolation silicon-dioxide node, said source conductive node, and said capacitor-node connector are patterned by a pair of second sidewall dielectric spacers being formed over outer sidewalls of said nearby self-aligned common-drain regions; and said self-aligned common-drain region comprising: a common-drain diffusion region of said second conductivity type being formed in said semiconductor substrate of each of the plurality of active regions, a pair of fifth sidewall dielectric spacers being formed over outer sidewalls of nearby scalable trench regions, and a flat bed being located between said pair of fifth sidewall dielectric spacers and formed alternately by said common-drain diffusion region of said second conductivity type in said active region and a first-type fourth raised field-oxide layer in said first-type STI region, wherein said active region under said common-drain diffusion region comprises a deep implant region of said first conductivity type being formed in said semiconductor substrate near a middle portion outside of said gate-dielectric layer in said vertical transistor region, said common-source diffusion region of said second conductivity type being formed in said semiconductor substrate near an outer portion of said source conductive node, and a deeper implant region of said first conductivity type being formed in said semiconductor substrate near a middle portion outside of said collar-oxide layer.

8. The contactless DRAM array according to claim 7, wherein a plurality of planarized common-drain conductive islands are formed over said common-drain diffusion regions between said pair of fifth sidewall dielectric spacers and a plurality of metal bit-lines integrated with said planarized common-drain conductive islands are simultaneously patterned by a masking photoresist step being aligned above the plurality of active regions for forming a first-type contactless DRAM array.

9. The contactless DRAM array according to claim 7, wherein a common-drain conductive bus-line being acted as a conductive bit-line is formed over said flat bed between said pair of fifth sidewall dielectric spacers and an etched-back third planarized thick-oxide layer is formed over said common-drain conductive bus-line for forming a second-type contactless DRAM array.

10. The contactless DRAM array according to claim 7, wherein a capping conductive-gate layer being formed outside of a pair of third sidewall dielectric spacers and being defined by a pair of fourth sidewall dielectric spacers to act as a pair of conductive word-lines is formed over said conductive-gate nodes in the plurality of paired deep-trench regions for forming a first-type contactless DRAM array.

11. The contactless DRAM, array according to claim 7, wherein common-gate conductive connector islands being connected with each side portion of said conductive-gate nodes in the plurality of paired deep-trench regions and a plurality of metal word-lines integrated with planarized common-gate conductive islands over said common-gate conductive connector islands are simultaneously patterned by a masking photoresist step being aligned above the plurality of active regions for forming a second-type contactless DRAM array.

12. The contactless DRAM array according to claim 7, wherein a bottom surface level of said second-type STI region is approximately equal to that of said collar-oxide layer and a heavily-implanted region of said second conductivity type is formed in said semiconductor substrate under said second-type STI region and is connected with said lower capacitor nodes being formed by heavily-doped diffusion regions of said second conductivity type.

* * * * *